(12) United States Patent
Nam et al.

(10) Patent No.: US 10,892,019 B2
(45) Date of Patent: *Jan. 12, 2021

(54) METHODS OF ERASING DATA IN NONVOLATILE MEMORY DEVICES AND NONVOLATILE MEMORY DEVICES PERFORMING THE SAME

(71) Applicant: Samsung Electronics Co., Ltd., Suwon-si (KR)

(72) Inventors: Sang-Wan Nam, Hwaseong-si (KR); Dong-Hun Kwak, Hwaseong-si (KR); Chi-Weon Yoon, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 16/788,638

(22) Filed: Feb. 12, 2020

(65) Prior Publication Data
US 2020/0185038 A1    Jun. 11, 2020

Related U.S. Application Data

(63) Continuation of application No. 16/205,334, filed on Nov. 30, 2018, now Pat. No. 10,600,487.

(30) Foreign Application Priority Data

Mar. 12, 2018    (KR) .................. 10-2018-0028390

(51) Int. Cl.
| | | |
|---|---|---|
| *G11C 16/04* | (2006.01) | |
| *G11C 16/16* | (2006.01) | |
| *G11C 8/12* | (2006.01) | |
| *H01L 27/11573* | (2017.01) | |
| *H01L 27/11582* | (2017.01) | |
| *G11C 16/14* | (2006.01) | |

(52) U.S. Cl.
CPC .......... *G11C 16/16* (2013.01); *G11C 16/0483* (2013.01); *H01L 27/11573* (2013.01); *H01L 27/11582* (2013.01); *G11C 16/14* (2013.01)

(58) Field of Classification Search
CPC ..... G11C 16/16; G11C 16/0483; G11C 16/14; H01L 27/11573; H01L 27/11582
USPC .................................................. 365/185.11
See application file for complete search history.

(56) References Cited

U.S. PATENT DOCUMENTS

| | | |
|---|---|---|
| 8,873,301 B2 | 10/2014 | Kwon et al. |
| 9,007,834 B2 | 4/2015 | Rhie |
| 9,299,447 B2 | 3/2016 | Lee et al. |
| 9,318,209 B1 | 4/2016 | Huynh et al. |

(Continued)

FOREIGN PATENT DOCUMENTS

KR    10-1748884 B1    6/2017

*Primary Examiner* — Ly D Pham
(74) *Attorney, Agent, or Firm* — Myers Bigel, P.A.

(57) ABSTRACT

A method of operating a nonvolatile memory device includes erasing data within a NAND string of memory cells within the memory device by applying a non-zero erase voltage to a source/drain terminal at a first end of the NAND string. This erase voltage is applied concurrently with establishing gate-induced drain leakage (GIDL) in a pair of selection transistors within the NAND string. This GIDL can occur by applying unequal and non-zero first and second voltages to respective first and second gate terminals of the pair of selection transistors. The selection transistors can be string selection transistors or ground selection transistors.

9 Claims, 27 Drawing Sheets

(56) References Cited

U.S. PATENT DOCUMENTS

| | | |
|---|---|---|
| 9,330,771 B2 | 5/2016 | Shim |
| 9,620,217 B2 | 4/2017 | Lue et al. |
| 9,685,235 B2 | 6/2017 | Park et al. |
| 9,747,995 B2 | 8/2017 | Shim et al. |
| 9,754,673 B2 | 9/2017 | Park et al. |
| 9,859,010 B2 | 1/2018 | Lee |
| 9,893,084 B2 | 2/2018 | Rhie |
| 10,600,487 B2 * | 3/2020 | Nam .................. H01L 27/11582 |
| 2004/0125629 A1 * | 7/2004 | Scheuerlein ....... G11C 16/0483 365/17 |
| 2013/0100742 A1 | 4/2013 | Lee et al. |
| 2015/0170749 A1 | 6/2015 | Park et al. |
| 2015/0179271 A1 * | 6/2015 | Nam .................. G11C 16/0483 365/218 |
| 2016/0276035 A1 | 9/2016 | So et al. |
| 2018/0240522 A1 | 8/2018 | Jung |

\* cited by examiner

METHODS OF ERASING DATA IN NONVOLATILE MEMORY DEVICES AND NONVOLATILE MEMORY DEVICES PERFORMING THE SAME

REFERENCE TO PRIORITY APPLICATION

This application is a continuation application of and claims priority from U.S. patent application Ser. No. 16/205,334, filed Nov. 30, 2018, which claims priority under 35 USC § 119 to Korean Patent Application No. 10-2018-0028390, filed Mar. 12, 2018, the contents of which are hereby incorporated herein by reference in entirety.

BACKGROUND

1. Technical Field

Example embodiments relate generally to semiconductor devices and, more particularly, to methods of erasing data in nonvolatile memory devices and nonvolatile memory devices performing the methods.

2. Description of the Related Art

Semiconductor memory devices can generally be divided into two categories depending upon whether or not they retain stored data when disconnected from a power supply. These categories include volatile memory devices, which lose stored data when disconnected from power, and nonvolatile memory devices, which retain stored data when disconnected from power. Volatile memory devices may perform read and write operations at a high speed, while contents stored therein may be lost at power-off. Nonvolatile memory devices may retain contents stored therein even at power-off, which means they may be used to store data that must be retained regardless of whether they are powered. Recently, semiconductor memory devices having memory cells that are stacked "vertically" (i.e., in three dimensions (3D)) have been researched to improve the capacity and integration density of the semiconductor memory devices.

SUMMARY

At least one example embodiment of the present disclosure provides a method of erasing data in a nonvolatile memory device, which contains memory cells stacked in three dimensions to thereby improve characteristics and reliability of a data erase operations.

At least one example embodiment of the present disclosure provides nonvolatile memory devices performing methods of erasing data.

According to example embodiments, in a method of erasing data in a nonvolatile memory device including one or more memory blocks, a plurality of memory cells are disposed in a vertical direction in each memory block. An erase voltage is applied to an erase source terminal of a memory block. A first voltage is applied to a first selection line among a plurality of selection lines in the memory block. The first voltage is higher than the erase voltage. The first selection line is disposed closest to the erase source terminal among the plurality of selection lines and is used for selecting the memory block as an erase target block. A second voltage is applied to a second selection line among the plurality of selection lines. The second voltage is a non-zero voltage that is lower than the erase voltage. The second selection line is disposed farther from the erase source terminal than the first selection line and is used for selecting the memory block as the erase target block.

According to example embodiments, in a method of erasing data in a nonvolatile memory device including one or more memory blocks, a plurality of memory cells are disposed in a vertical direction in each memory block, and each memory block is divided into a first sub-block and a second sub-block in the vertical direction. An erase voltage is applied to an erase source terminal of a memory block. A first voltage is applied to a first selection line among a plurality of selection lines in the memory block. The first voltage is higher than the erase voltage. The first selection line is disposed closest to the erase source terminal among the plurality of selection lines and is used for selecting the first sub-block as an erase target sub-block. The first voltage or a second voltage is applied to a second selection line among the plurality of selection lines based on a location relationship between the erase source terminal and the first sub-block. The second voltage is lower than the erase voltage. The second selection line is disposed farther from the erase source terminal than the first selection line and is used for selecting the first sub-block as the erase target sub-block.

According to additional example embodiments, a nonvolatile memory device includes a memory block and a control circuit. The memory block includes a plurality of memory cells disposed in a vertical direction. The control circuit to applies an erase voltage to an erase source terminal of the memory block, and applies a first voltage to a first selection line among a plurality of selection lines in the memory block. The first voltage is higher than the erase voltage. The first selection line is disposed closest to the erase source terminal among the plurality of selection lines and is used for selecting the memory block as an erase target block.

In a method of erasing data according to further embodiments and the nonvolatile memory device according to further embodiments, the first voltage higher than the erase voltage may be applied to the first selection line disposed closest to the erase source terminal (e.g., the common source line contact and/or the bitline), the second voltage lower than the erase voltage may be applied to the second selection line disposed farther from the erase source terminal than the first selection line, and GIDL may occur between the first and second selection lines. Accordingly, the erase voltage applied to the erase source terminal may be efficiently provided or delivered to the channel in the memory block, and the data erase operation based on the GIDL scheme may be efficiently performed. In addition, the location of occurring GIDL may be changed according to the number of times in which the data erase operation has been performed, and thus reliability of the data erase operation may be improved.

Further, when the memory block is implemented with the multi-stacked structure, the location of occurring GIDL may be disposed in middle of cell strings according to the location of the erase target sub-block.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
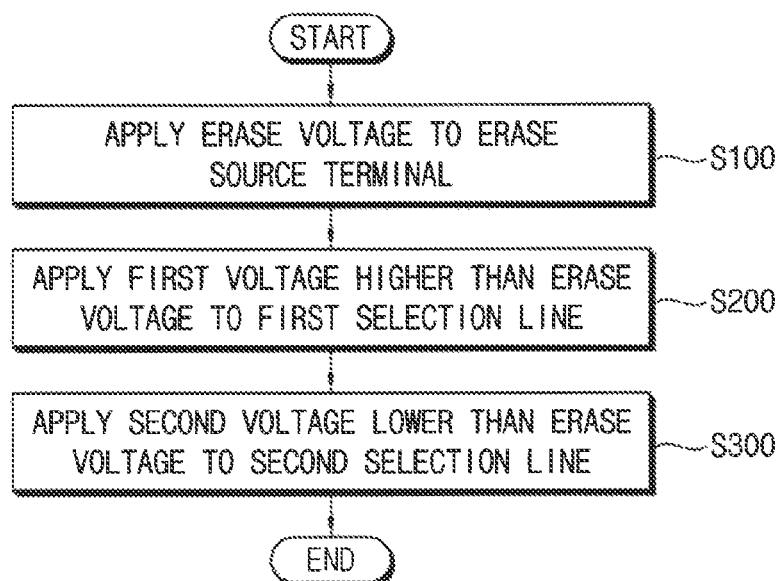
FIG. 1 is a flow chart illustrating a method of erasing data in a nonvolatile memory device according to example embodiments.

Various example embodiments will be described more fully with reference to the accompanying drawings, in which embodiments of the invention are shown. The present disclosure may, however, be embodied in many different forms and should not be construed as limited to the embodiments set forth herein. Like reference numerals refer to like elements throughout this application.

FIG. 1 is a flow chart illustrating a method of erasing data in a nonvolatile memory device according to example embodiments of the invention. Referring to FIG. 1, a method of erasing data according to example embodiments is performed by a nonvolatile memory device including one or more memory blocks, and a plurality of memory cells are disposed in a vertical direction within each memory block. In other words, each memory block includes a plurality of memory cells that are stacked in a vertical direction (i.e., substantially perpendicular to) relative to a surface of a substrate. Configurations of the nonvolatile memory device and the memory block will be described in detail with reference to FIGS. 2 through 4.

In the method of erasing data in the nonvolatile memory device according to example embodiments, an erase voltage is applied to an erase source terminal of the memory block (step S100). The erase source terminal represents a terminal that receives the erase voltage from an outside of the memory block (e.g., from a voltage generator). For example, the erase source terminal may include at least one of a common source line contact that is formed or disposed in a lower portion of the memory block (e.g., in the substrate) and a bitline that is formed or disposed in an upper portion of the memory block (e.g., on the plurality of memory cells).

A first voltage that is higher than the erase voltage is applied to a first selection line among a plurality of selection lines in the memory block (step S200). The first selection line represents a selection line that is disposed closest to the erase source terminal among the plurality of selection lines and is used for selecting the memory block as an erase target block. For example, the plurality of selection lines may include a plurality of ground selection lines that are disposed in the lower portion of the memory block and on the common source line contact, and a plurality of string selection lines that are disposed in the upper portion of the memory block and under the bitline.

A second voltage that is lower than the erase voltage is applied to a second selection line among the plurality of selection lines (step S300). The second selection line represents a selection line that is disposed farther from the erase source terminal than the first selection line and is used for selecting the memory block as the erase target block.

The first and second selection lines may be the same type of selection lines. For example, when the first selection line is one of the plurality of ground selection lines, the second selection line may be another of the plurality of ground selection lines. When the first selection line is one of the plurality of string selection lines, the second selection line may be another of the plurality of string selection lines. Thus, the memory block included in the nonvolatile memory device according to example embodiments may include two or more ground selection lines that are disposed in the vertical direction and two or more string selection lines that are disposed in the vertical direction relative to the substrate.

The method of erasing data in the nonvolatile memory device according to example embodiments may be performed based on a gate induced drain lowering or a gate induced drain leakage (GIDL) scheme. For example, the first voltage may be applied to the first selection line, the second voltage may be applied to the second selection line, and thus a GIDL may occur or may be generated between the first selection line and the second selection line, as will be described later.

In addition, the method of erasing data in the nonvolatile memory device according to example embodiments may be performed based on a command and an address for performing the data erase operation (e.g., in response to receiving an erase command and an address for the erase target block).

Figure 2:
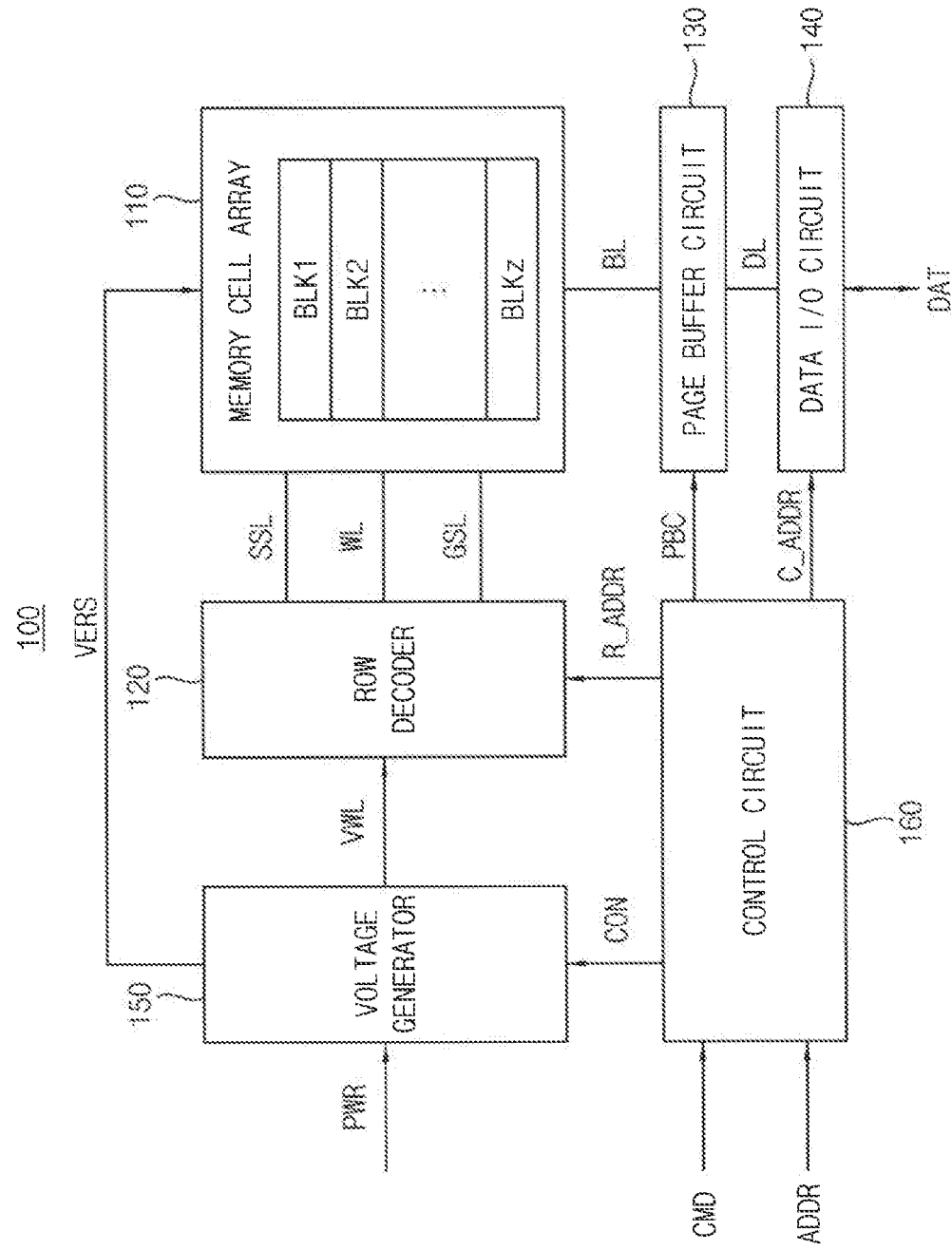
FIG. 2 is a block diagram illustrating a nonvolatile memory device according to example embodiments.

FIG. 2 is a block diagram illustrating a nonvolatile memory device according to example embodiments of the invention (a/k/a/inventive concept). Referring to FIG. 2, a nonvolatile memory device 100 according to an embodiment of the invention includes, among other things, a memory cell array 110, a row decoder 120, a page buffer circuit 130, a data input/output (I/O) circuit 140, a voltage generator 150 and a control circuit 160. The memory cell array 110 is connected to the row decoder 120 via a plurality of string selection lines SSL, a plurality of wordlines WL and a plurality of ground selection lines GSL. The memory cell array 110 is further connected to the page buffer circuit 130 via a plurality of bitlines BL. The memory cell array 110 may include a plurality of memory cells (e.g., a plurality of nonvolatile memory cells) that are connected to the plurality of wordlines WL and the plurality of bitlines BL. The memory cell array 110 may be divided into a plurality of memory blocks BLK1, BLK2, . . . , BLKz, each of which includes memory cells.

In some example embodiments, as will be described with reference to FIGS. 3 and 4, the memory cell array 110 may be a three-dimensional memory cell array, which is formed on a substrate in a three-dimensional structure (or a vertical structure). In this example, the memory cell array 110 may include a plurality of cell strings (e.g., a plurality of vertical NAND strings) that are vertically oriented such that at least one memory cell is located over another memory cell.

The control circuit 160 receives a command CMD and an address ADDR from a memory controller (e.g., a memory controller 600 in FIG. 26), and control erasure, programming and read operations of the nonvolatile memory device 100 based on the command CMD and the address ADDR. An erasure operation may include performing a sequence of erase loops, and a program operation may include performing a sequence of program loops. Each program loop may include a program operation and a program verification operation. Each erase loop may include an erase operation and an erase verification operation. The read operation may include a normal read operation and data recover read operation.

For example, the control circuit 160 may generate control signals CON, which are used for controlling the voltage generator 150, and may generate control signal PBC for controlling the page buffer circuit 130, based on the command CMD, and may generate a row address R_ADDR and a column address C_ADDR based on the address ADDR. The control circuit 160 may provide the row address R_ADDR to the row decoder 120 and may provide the column address C_ADDR to the data I/O circuit 140.

In addition, the control circuit 160 operates to control the row decoder 120, the page buffer circuit 130, the data I/O circuit 140 and the voltage generator 150 based on the command CMD and the address ADDR, to thereby perform methods of erasing data in the nonvolatile memory device 100 according to example embodiments of the invention (e.g., the method of FIG. 1, etc.).

The row decoder 120 may be connected to the memory cell array 110 via the plurality of string selection lines SSL, the plurality of wordlines WL and the plurality of ground selection lines GSL. For example, in the data erase/write/read operations, the row decoder 120 may determine at least one of the plurality of wordlines WL as a selected wordline, and may determine the rest or remainder of the plurality of wordlines WL other than the selected wordline as unselected wordlines, based on the row address R_ADDR. In addition, in the data erase/write/read operations, the row decoder 120 may determine at least one of the plurality of string selection lines SSL as a selected string selection line, and may determine the rest or remainder of the plurality of string selection lines SSL other than the selected string selection line as unselected string selection lines, based on the row address R_ADDR.

Furthermore, in the data erase/write/read operations, the row decoder 120 may determine at least one of the plurality of ground selection lines GSL as a selected ground selection line, and may determine the rest or remainder of the plurality of ground selection lines GSL other than the selected ground selection line as unselected ground selection lines, based on the row address R_ADDR.

The voltage generator 150 may generate wordline voltages VWL that are required for an operation of the nonvolatile memory device 100 based on a power PWR and the control signals CON. The wordline voltages VWL may be applied to the plurality of wordlines WL via the row decoder 120. For example, the wordline voltages VWL may include the first voltage and the second voltage described with reference to FIG. 1. In addition, the voltage generator 150 may generate an erase voltage VERS that is required for the data erase operation based on the power PWR and the control signals CON. The erase voltage VERS may be applied to the memory cell array 110 directly or via the bitline BL.

For example, during the erase operation, the voltage generator 150 may apply the erase voltage VERS to a common source line contact and/or the bitline BL of a memory block (e.g., a selected memory block) and may apply an erase permission voltage (e.g., a ground voltage) to all wordlines of the memory block or a portion of the wordlines via the row decoder 120. In addition, during the erase verification operation, the voltage generator 150 may apply an erase verification voltage simultaneously to all wordlines of the memory block or sequentially to the wordlines one by one.

For example, during a program operation, the voltage generator 150 may apply a program voltage to the selected wordline and may apply a program pass voltage to the unselected wordlines via the row decoder 120. In addition, during a program verification operation, the voltage generator 150 may apply a program verification voltage to the selected wordline and may apply a verification pass voltage to the unselected wordlines via the row decoder 120.

In addition, during a normal read operation, the voltage generator 150 may apply a read voltage to the selected wordline and may apply a read pass voltage to the unselected wordlines via the row decoder 120. During a data recover read operation, the voltage generator 150 may apply the read voltage to a wordline adjacent to the selected wordline and may apply a recover read voltage to the selected wordline via the row decoder 120.

The page buffer circuit 130 may be connected to the memory cell array 110 via the plurality of bitlines BL. The page buffer circuit 130 may include a plurality of page buffers. In some example embodiments of the invention, each page buffer may be connected to one bitline. In other example embodiments, each page buffer may be connected to two or more bitlines.

The page buffer circuit 130 may store data DAT to be programmed into the memory cell array 110 or may read data DAT sensed from the memory cell array 110. In other words, the page buffer circuit 130 may operate as a write driver or a sensing amplifier according to an operation mode of the nonvolatile memory device 100.

The data I/O circuit 140 may be connected to the page buffer circuit 130 via data lines DL. The data I/O circuit 140 may provide the data DAT from an outside of the nonvolatile memory device 100 (e.g., from the memory controller 600 in FIG. 26) to the memory cell array 110 via the page buffer circuit 130 or may provide the data DAT from the memory cell array 110 to the outside of the nonvolatile memory device 100, based on the column address C_ADDR.

Figure 3:
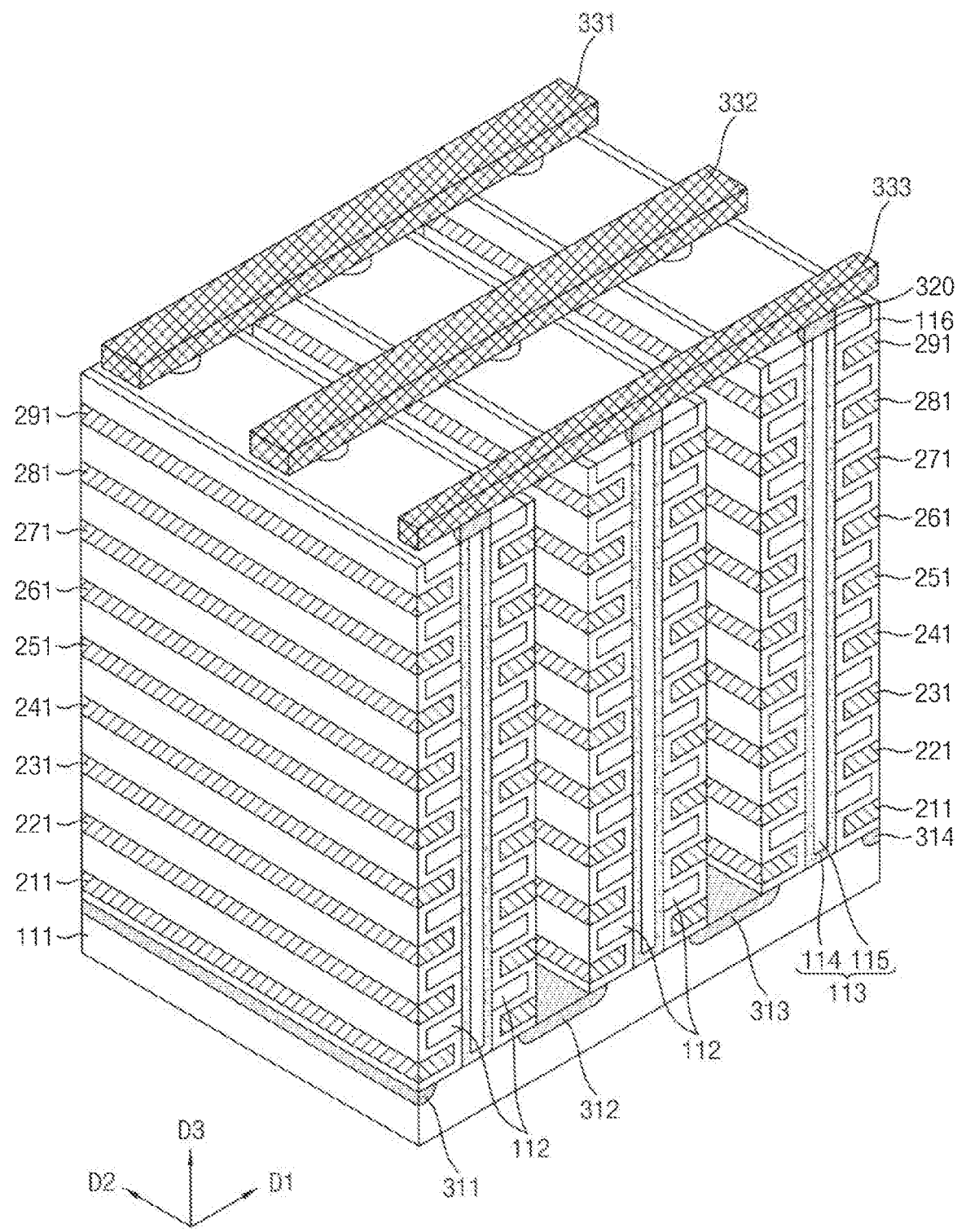
FIG. 3 is a perspective view illustrating an example of a memory block that is included in a memory cell array of the nonvolatile memory device of FIG. 2.

FIG. 3 is a perspective view illustrating an example of a memory block that is included in a memory cell array of the nonvolatile memory device of FIG. 2. Referring to FIG. 3, a memory block BLKi includes NAND strings which are formed on a substrate in a three-dimensional structure (or a vertical structure). The memory block BLKi includes structures extending along first, second and third directions D1, D2 and D3. A substrate 111 is provided. For example, the substrate 111 may have a well of a first type (e.g., a first conductivity type) therein. For example, the substrate 111 may have a p-well formed by implanting a group 3 element such as boron (B). In particular, the substrate 111 may have a pocket p-well provided within an n-well. In an embodiment, the substrate 111 has a p-type well (or a p-type pocket well). However, the conductive type of the substrate 111 is not limited to p-type.

A plurality of doping regions 311, 312, 313 and 314 extending along the first direction D1 are provided in/on the substrate 111. These plurality of doping regions 311 to 314 may have a second type (e.g., a second conductive type) different from the first type of the substrate 111. In one embodiment of the invention, the first to fourth doping regions 311 to 314 may have an n-type. However, the conductive type of the first to fourth doping regions 311 to 314 is not limited to n-type.

A plurality of insulation materials 112 extending along the second direction D2 are sequentially provided along the third direction D3 on a region of the substrate 111 between the first and second doping regions 311 and 312. For example, the plurality of insulation materials 112 are provided along the second direction D3, being spaced by a specific distance. For example, the insulation materials 112 may include an insulation material such as an oxide layer.

A plurality of pillars 113 penetrating the insulation materials along the third direction D3 are sequentially disposed along the second direction D2 on a region of the substrate 111 between the first and second doping regions 311 and 312. For example, the plurality of pillars 113 penetrate the insulation materials 112 to contact the substrate 111. In some example embodiments, each pillar 113 may include a plurality of materials. For example, a channel layer 114 of each pillar 113 may include a silicon material having a first conductivity type. For example, the channel layer 114 of each pillar 113 may include a silicon material having the same conductivity type as the substrate 111. In one embodiment of the invention, the channel layer 114 of each pillar 113 includes p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. In some examples, the inner material 115 of each pillar 113 may include an air gap.

An insulation layer 116 is provided along the exposed surfaces of the insulation materials 112, the pillars 113, and the substrate 111, on a region between the first and second doping regions 311 and 312. For example, the insulation layer 116 provided on surfaces of the insulation material 112 may be interposed between pillars 113 and a plurality of stacked first conductive materials 211, 221, 231, 241, 251, 261, 271, 281 and 291, as illustrated. In some examples, the insulation layer 116 need not be provided between the first conductive materials 211 to 291 corresponding to ground selection lines GSL (e.g., 211) and string selection lines SSL (e.g., 291). In this example, the ground selection lines GSL are the lowermost ones of the stack of first conductive materials 211 to 291 and the string selection lines SSL are the uppermost ones of the stack of first conductive materials 211 to 291.

The plurality of first conductive materials 211 to 291 are provided on surfaces of the insulation layer 116, in a region between the first and second doping regions 311 and 312. For example, the first conductive material 211 extending along the second direction D2 is provided between the insulation material 112 adjacent to the substrate 111 and the substrate 111. In more detail, the first conductive material 211 extending along the second direction D2 is provided between the insulation layer 116 at the bottom of the insulation material 112 adjacent to the substrate 111 and the substrate 111.

A first conductive material extending along the second direction D2 is provided between the insulation layer 116 at the top of the specific insulation material among the insulation materials 112 and the insulation layer 116 at the bottom of a specific insulation material among the insulation materials 112. For example, a plurality of first conductive materials 221 to 281 extending along the second direction D2 are provided between the insulation materials 112 and it may be understood that the insulation layer 116 is provided between the insulation materials 112 and the first conductive materials 221 to 281. The first conductive materials 211 to 291 may be formed of a conductive metal, but in other embodiments of the invention the first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, a plurality of insulation materials 112 are provided, which extend along the second direction D2. And, a plurality of pillars 113 are provided that are disposed sequentially along the second direction D2 and penetrate the plurality of insulation materials 112 along the third direction D3. An insulation layer 116 is provided on the exposed surfaces of the plurality of insulation materials 112 and the plurality of pillars 113, and a plurality of first conductive materials 211 to 291 extend along the second direction D2. Similarly, the same structures as those on the first and second doping regions 311 and 312 may be provided in a region between the third and fourth doping regions 313 and 314.

A plurality of drain regions 320 are provided on the plurality of pillars 113, respectively. The drain regions 320 may include silicon materials doped with a second type. For example, the drain regions 320 may include silicon materials doped with an n-type dopant. In one embodiment of the invention, the drain regions 320 include n-type silicon materials. However, the drain regions 320 are not limited to n-type silicon materials.

On the drain regions, a plurality of second conductive materials 331, 332 and 333 are provided, which extend along the first direction D1. The second conductive materials 331 to 333 are disposed along the second direction D2, being spaced by a specific distance. The second conductive materials 331 to 333 are respectively connected to the drains 320 in a corresponding region. The drains 320 and the second conductive material 333 extending along the first direction D1 may be connected through each contact plug. The second conductive materials 331 to 333 may include metal materials. The second conductive materials 331 to 333 may include conductive materials such as a polysilicon.

In an example of FIG. 3, the first conductive materials 211 to 291 may be used to form the wordlines WL, the string selection lines SSL and the ground selection lines GSL. For example, the first conductive materials 221 to 281 may be used to form the wordlines WL, where conductive materials belonging to the same layer may be interconnected. The second conductive materials 331 to 333 may be used to form the bitlines BL. The number of layers of the first conductive materials 211 to 291 may be changed variously according to process and control techniques.

Figure 4:
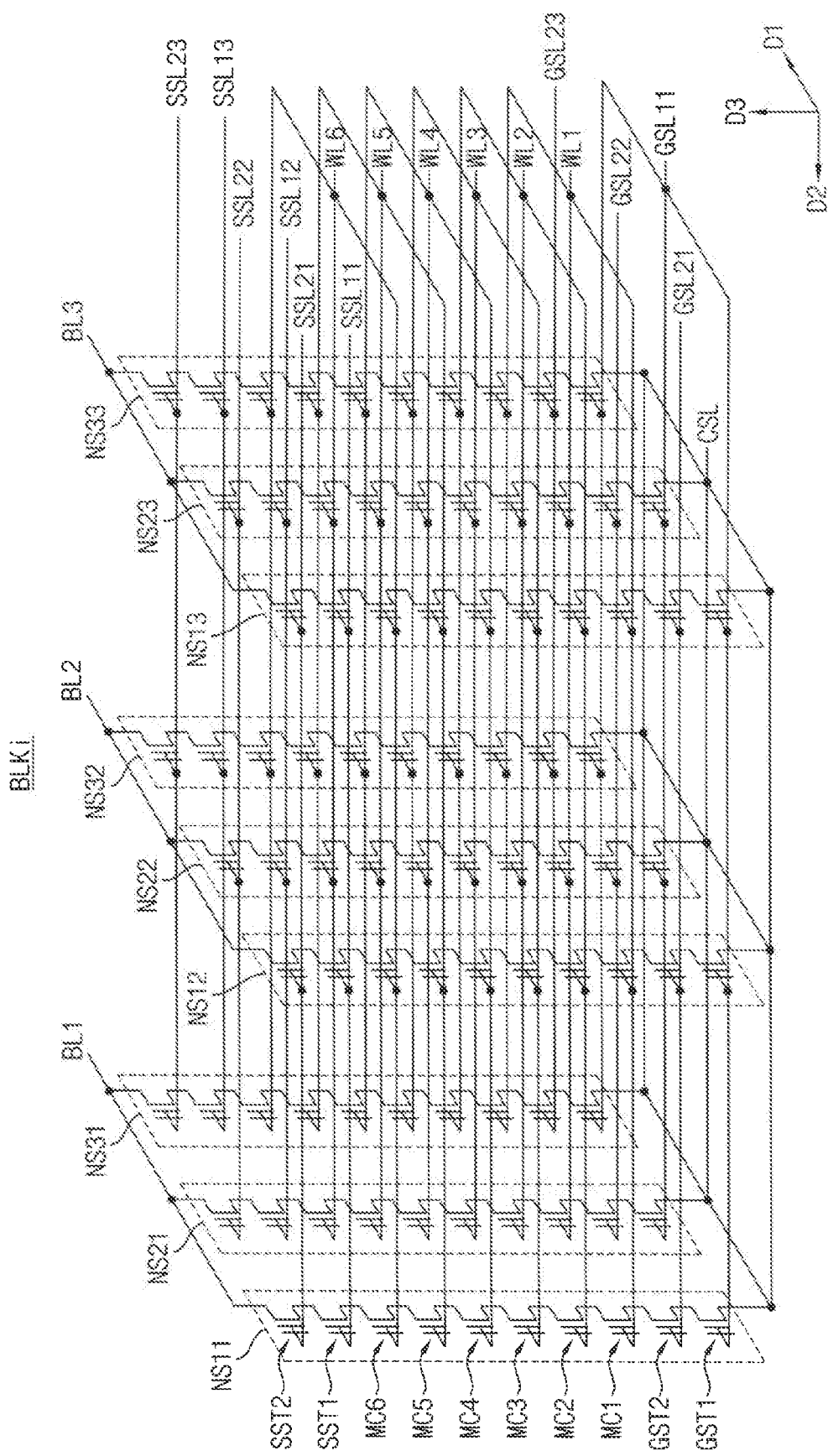
FIG. 4 is a circuit diagram illustrating an equivalent circuit of the memory block described with reference to FIG. 3.

FIG. 4 is a circuit diagram (i.e., electrical schematic) illustrating an equivalent circuit of the memory block described with reference to FIG. 3. The memory block BLKi of FIG. 4 may be formed on a substrate in a three-dimensional structure (or a vertical structure). For example, a plurality of cell strings or NAND strings included in the memory block BLKi may be formed in a direction perpendicular to the substrate. Referring to FIG. 4, the memory block BLKi may include a plurality of NAND strings NS11, NS12, NS13, NS21, NS22, NS23, NS31, NS32 and NS33 connected between bitlines BL1, BL2 and BL3 and a common source line CSL, as illustrated. Each of the NAND strings NS11 to NS33 may include a plurality of string selection transistors SST1 and SST2, a plurality of memory cells MC1, MC2, MC3, MC4, MC5 and MC6, and a plurality of ground selection transistors GST1 and GST2. For example, the bitlines BL1 to BL3 may correspond to the second conductive materials 331 to 333 in FIG. 3, and the common source line CSL may be formed by interconnecting the first to fourth doping regions 311 to 314 in FIG. 3.

The plurality of string selection transistors SST1 and SST2 may be connected to corresponding string selection lines SSL11, SSL12, SSL13, SSL21, SSL22 and SSL23, respectively. The plurality of memory cells MC1 to MC6 may be connected to corresponding wordlines WL1, WL2, WL3, WL4, WL5 and WL6, respectively. The plurality of ground selection transistors GST1 and GST2 may be connected to corresponding ground selection lines GSL11, GSL21, GSL22 and GSL23, respectively. The uppermost string selection transistors SST2 may be connected to corresponding bitlines BL1 to BL3, respectively, and the lowermost ground selection transistors GST1 may be connected to the common source line CSL. In the example of FIG. 4, some of the string selection transistors are connected to the same bitline to connect corresponding NAND strings to the same bitline upon appropriate selection via selection voltages applied to the appropriate sting selection lines and ground selection lines.

The cell strings connected in common to one bitline may form one column, and the cell strings connected to one string selection line may form one row. For example, the cell strings NS11, NS21 and NS31 connected to the first bitline BL1 may correspond to a first column, and the cell strings NS11, NS12 and NS13 connected to the first string selection line SSL1 may form a first row.

Wordlines (e.g., WL1) having the same height may be commonly connected, the ground selection lines GSL11 may be commonly connected, and the ground selection lines GSL21, GSL22 and GSL23 and the string selection lines SSL11, SSL12, SSL13, SSL21, SSL22 and SSL23 may be separated. Memory cells located at the same semiconductor layer share a wordline. Cell strings in the same row share a string selection line. The common source line CSL is connected in common to all of the cell strings.

In FIG. 4, the memory block BLKi is illustrated as being connected to six wordlines WL1 to WL6, three bitlines BL1 to BL3, the string selection lines SSL11, SSL12, SSL13, SSL21, SSL22 and SSL23 with two stages, and the ground selection lines GSL11, GSL21, GSL22 and GSL23 with two stages, and each of the NAND strings NS11 to NS33 is illustrated to include six memory cells MC1 to MC6. However, the inventive concepts are not limited to these illustrated embodiments. In some example embodiments, each memory block in the memory cell array 100 may be connected to any number of wordlines, bitlines, string selection lines and ground selection lines, and each NAND string may include any number of memory cells. In addition, as will be described with reference to FIG. 20, the memory block may be divided into a plurality of sub-blocks that are disposed in the vertical direction (e.g., the third direction D3).

A three-dimensional vertical array structure may include vertical NAND strings that are vertically oriented such that at least one memory cell is located over another memory cell. The at least one memory cell may comprise a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

Although the memory cell array included in the nonvolatile memory device according to example embodiments is described based on a NAND flash memory device, the nonvolatile memory device according to example embodiments may be any nonvolatile memory device, e.g., a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

For convenience of illustration and description, memory cells are omitted in a memory block and the memory block includes only ground selection lines, wordlines, string selection lines and a bitline that are stacked on one another in the vertical direction in following figures.

Figure 5:
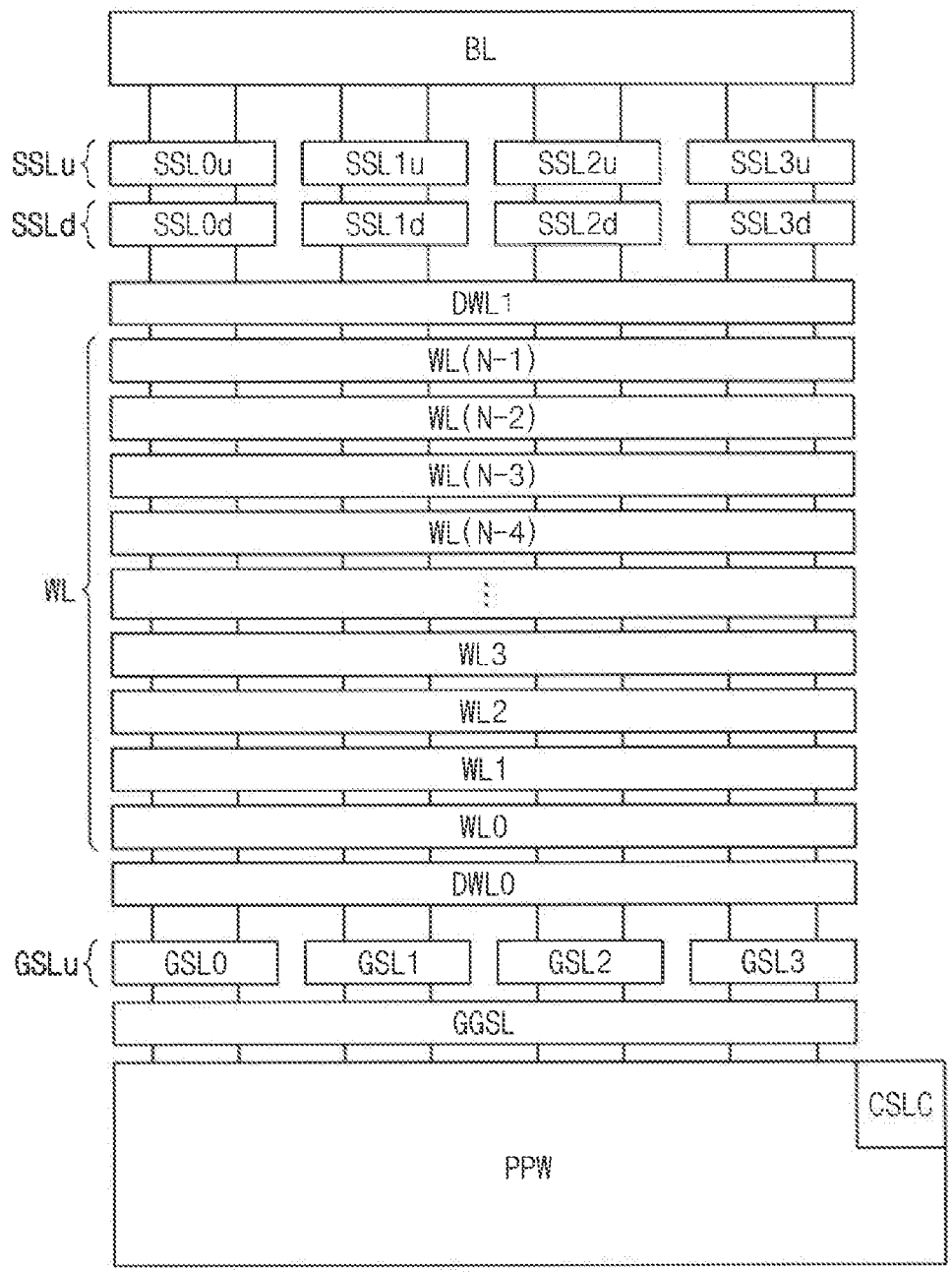
FIG. 5 is a cross-sectional view of an example of a memory block that is included in a nonvolatile memory device according to example embodiments.

FIG. 5 is a cross-sectional view of an example of a memory block that is included in a nonvolatile memory device according to example embodiments. Referring to FIG. 5, a memory block may include a plurality of memory cells disposed in the vertical direction, and may include a lower (or lowermost) ground selection line GGSL, upper ground selection lines GSLu (e.g., GSL0, GSL1, GSL2 and GSL3), a dummy wordline DWL0, wordlines WL (e.g., WL0, WL1, WL2, WL3, WL(N−4), WL(N−3), WL(N−2) and WL(N−1)), a dummy wordline DWL1, lower string selection lines SSLd (e.g., SSL0d, SSL1d, SSL2d and SSL3d), upper (or uppermost) string selection lines SSLu (e.g., SSL0u, SSL1u, SSL2u and SSL3u), and a bitline BL that are sequentially disposed on a substrate (or well) PPW in the vertical direction. The ground selection lines GGSL and GSL0 to GSL3 may be connected to ground selection transistors (e.g., the ground selection transistors GST1 and GST2 in FIG. 4), the dummy wordlines DWL0 and DWL1 may be connected to dummy memory cells, the wordlines WL0 to WL(N−1) may be connected to the memory cells (e.g., the memory cells MC1 to MC6 in FIG. 4), and the string selection lines SSL0$d$ to SSL3$d$ and SSL0$u$ to SSL3$u$ may be connected to string selection transistors (e.g., the string selection transistors SST1 and SST2 in FIG. 4). In some example embodiments, the dummy wordlines DWL0 and DWL1 may be omitted.

The memory block may include a common source line contact CSLC that is formed or disposed in a lower portion of the memory block (e.g., in the substrate PPW). In a plan view, the common source line contact CSLC may not be entirely formed in the lower portion of the memory block. For example, as illustrated in FIG. 5, the common source line contact CSLC may be disposed adjacent to the memory block and may not overlap the memory block in a plan view. For another example, as illustrated in FIG. 3, the common source line contact CSLC may partially overlap the memory block in a plan view. For example, the substrate PPW may be a p-type substrate, and the common source line contact CSLC may be an N-type region, such as an N+ region.

Figure 6:
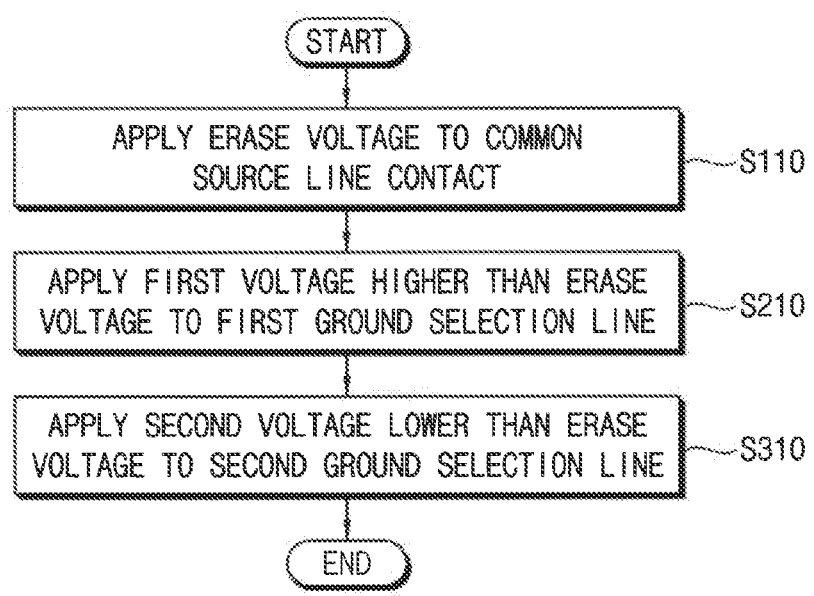
FIG. 6 is a flow chart illustrating an example of the method of FIG. 1.
Figure 7:
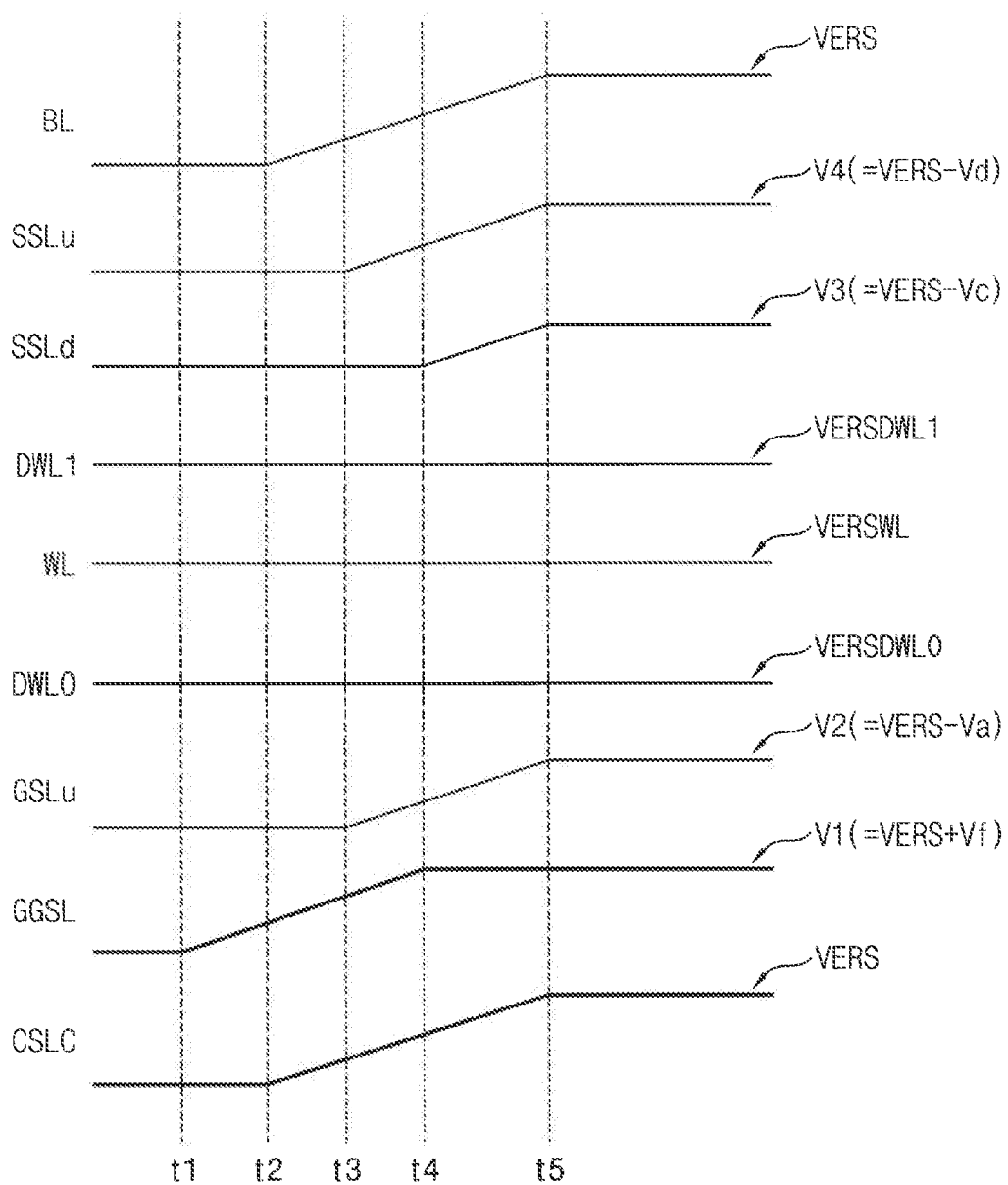
FIG. 7 is a timing diagram for describing the method of FIG. 6.

FIG. 6 is a flow chart illustrating one example of the method illustrated by the flow diagram of FIG. 1, and FIG. 7 is a timing diagram for describing the method of FIG. 6. Referring to FIGS. 1, 5, 6 and 7, in applying the erase voltage to the erase source terminal (step S100), the erase voltage VERS may be applied to the common source line contact CSLC (step S110). In applying the first voltage to the first selection line (step S200), a first voltage V1 may be applied to the ground selection line GGSL that is associated with the lowermost ground selection line (step S210). In applying the second voltage to the second selection line (step S300), a second voltage V2 may be applied to the ground selection lines GSLu that are disposed above the ground selection line GGSL (step S310), as illustrated.

As illustrated in FIG. 7, a level of the first voltage V1 may be higher than a level of the erase voltage VERS (e.g., V1=VERS+Vf), and a level of the second voltage V2 may be positive, yet lower than the level of the erase voltage VERS (e.g., V2=VERS−Va).

A data erase operation illustrated in FIGS. 6 and 7 may be performed based on the GIDL (i.e., gate-induced drain leakage) scheme. For example, the data erase operation in FIGS. 6 and 7 may be performed by a bottom GIDL scheme in which the erase voltage VERS is provided to the memory block from the common source line contact CSLC, which can be formed in a lower portion of the memory block.

As illustrated in FIG. 5, in the memory block according to example embodiments, the common source line is not entirely formed in the substrate PPW, and the common source line contact CSLC is formed in a portion of the substrate PPW. In this example, when the erase voltage VERS is only applied to the common source line contact CSLC, the substrate PPW may be floated (e.g., may have a floating state), and the erase voltage VERS may not be provided to a channel in the memory block.

Thus, in the method of erasing data in the nonvolatile memory device according to example embodiments, the first voltage V1 higher than the erase voltage VERS may be applied to the lowermost ground selection line GGSL that is disposed closest to the common source line contact CSLC to thereby deliver the erase voltage VERS to the upper ground selection lines GSLu, and the second voltage V2 lower than the erase voltage VERS may be applied to the upper ground selection lines GSLu to cause gate-induced drain leakage (i.e., GIDL) between the lowermost ground selection line GGSL and the upper ground selection lines GSLu. As a result, the erase voltage VERS applied to the common source line contact CSLC may be provided or delivered to the channel in the memory block. In other words, GIDL may occur between the common source line and the lowermost ground selection line GGSL in a conventional nonvolatile memory device. However, GIDL may also occur between the lowermost ground selection line GGSL and the upper ground selection lines GSLu in the nonvolatile memory device according to example embodiments. An energy band may be bent by the GIDL, and charges (e.g., holes) for the data erase operation may be generated and transferred (or moved).

In some example embodiments of the invention, the first voltage V1 may start to apply to the lowermost ground selection line GGSL at an early first time point t1, the erase voltage VERS may start to apply to the common source line contact CSLC at a second time point t2 that is later than the first time point t1, and the second voltage V2 may start to apply to the upper ground selection lines GSLu at a third time point t3 that is later than the second time point t2. The first voltage V1 may be applied prior to applying the erase voltage VERS, and thus the data erase operation may be efficiently performed.

In addition, while the erase voltage VERS is applied to the common source line contact CSLC, the same erase voltage VERS may be applied to the bitline BL, and voltages V3 and V4 may be applied to the string selection lines SSLd and SSLu, respectively. Levels of the voltages V3 and V4 may be lower than the level of the erase voltage VERS, respectively (e.g., V3=VERS−Vc and V4=VERS−Vd). For example, the erase voltage VERS may start to apply to the bitline BL at the second time point t2, the voltage V4 may start to apply to the uppermost string selection lines SSLu at the third time point t3, and the voltage V3 may start to apply to the lower string selection lines SSLd at a fourth time point t4, which is later than the third time point t3. A level increase of the first voltage V1 may be finished at the fourth time point t4, and level increases of voltages other than the first voltage V1 may be finished at a fifth time point t5 that is later than the fourth time point t4. According to example embodiments, the erase voltage VERS may be applied to all of the bitline BL and the string selection lines SSLd and SSLu as will be described with reference to FIG. 15, or all of the bitline BL and the string selection lines SSLd and SSLu may be floated.

Further, while the erase voltage VERS is applied to the common source line contact CSLC, an erase permission voltage VERSWL may be applied to the wordlines WL to erase data stored in the memory cells connected to the wordlines WL, and erase pass voltages VERSDWL0 and VERSDWL1 may be applied to the dummy wordlines DWL0 and DWL1. The erase permission voltage VERSWL may represent a voltage that is used for erasing the data stored in the memory cells, and a level difference between a voltage in the channel of the memory block and the erase permission voltage VERSWL may be relatively low during the data erase operation. For example, when the erase voltage VERS of about 18V is applied to the channel of the memory block, the erase permission voltage VERSWL may be set to a ground voltage (e.g., about 0V).

Figure 8:
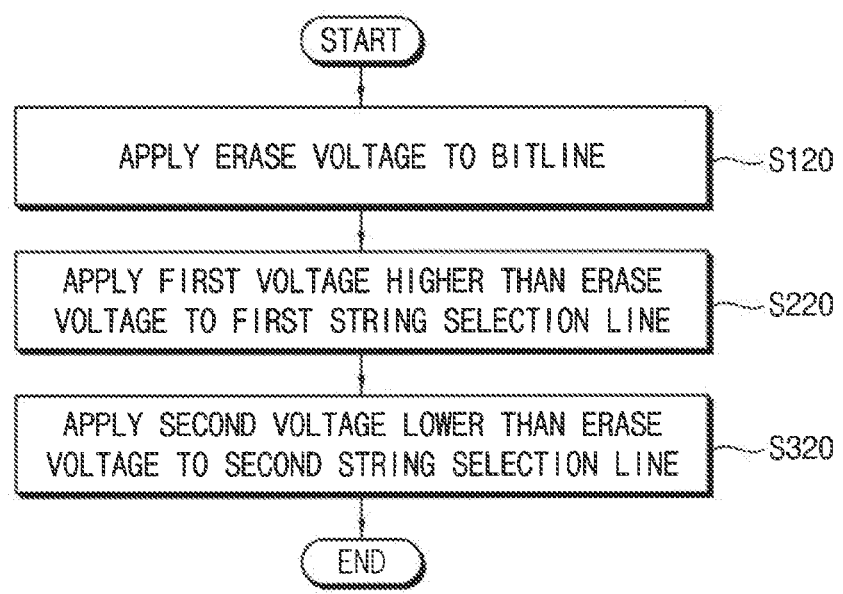
FIG. 8 is a flow chart illustrating another example of the method of FIG. 1.
Figure 9:
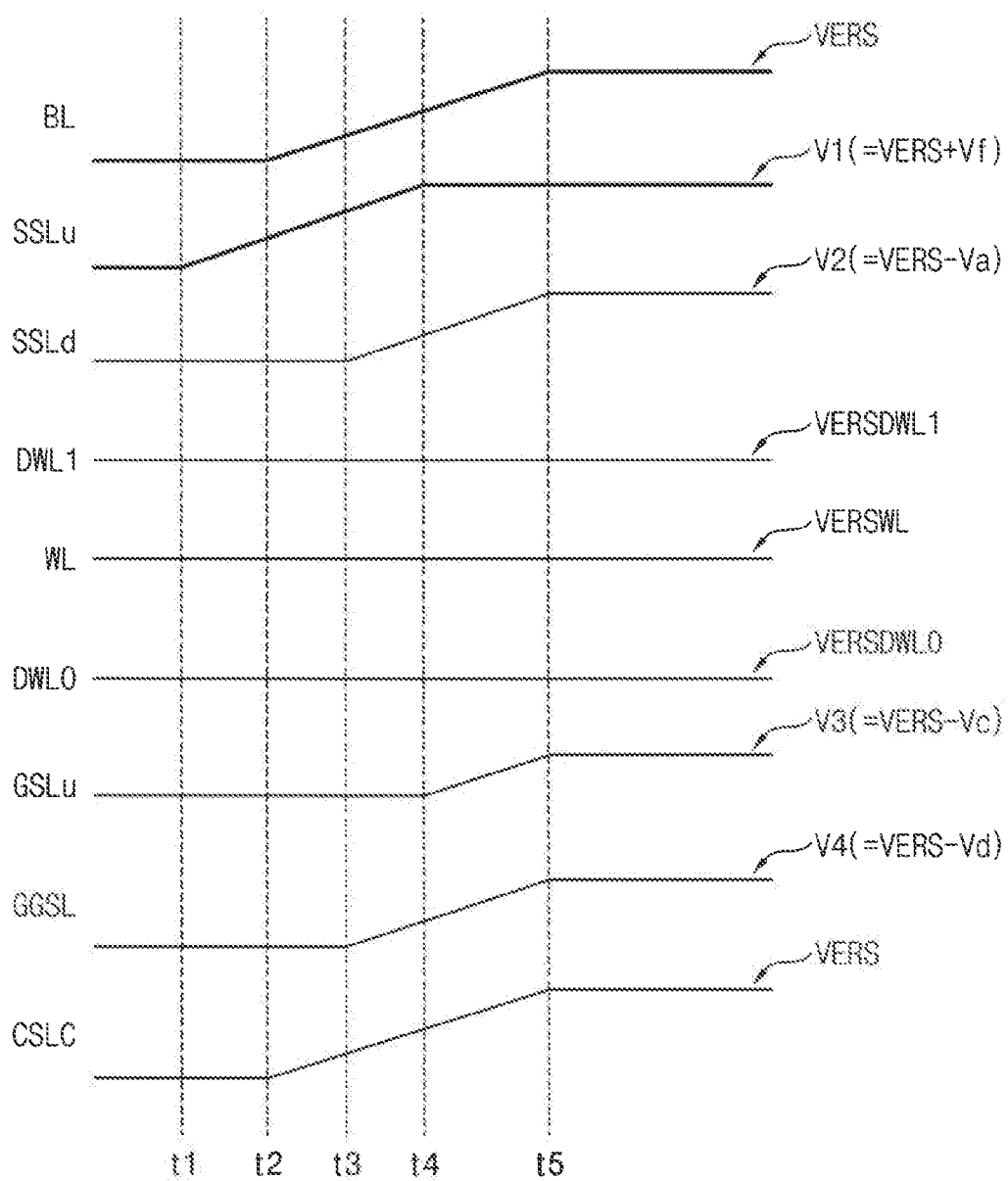
FIG. 9 is a timing diagram for describing the method of FIG. 8.

FIG. 8 is a flow chart illustrating another embodiment of the method of FIG. 1, and FIG. 9 is a timing diagram for describing the method of FIG. 8. Referring to FIGS. 1, 5, 8 and 9, when applying the erase voltage to the erase source terminal (step S100), the erase voltage VERS may be applied to the bitline BL (step S120). When applying the first voltage to the first selection line (step S200), the first voltage V1 may be applied to the string selection lines SSLu that are the uppermost string selection lines (step S220). When applying the second voltage to the second selection line (step S300), the second voltage V2 may be applied to the string selection lines SSLd that are disposed lower than the string selection lines SSLu (step S320).

A data erase operation illustrated in FIGS. 8 and 9 may be performed based on the GIDL scheme. For example, the data erase operation in FIGS. 8 and 9 may be performed by a top GIDL scheme in which the erase voltage VERS is provided to the memory block from the bitline BL that is formed in an upper portion of the memory block.

As with the bottom GIDL scheme, the first voltage V1 higher than the erase voltage VERS may be applied to the uppermost string selection lines SSLu that are disposed closest to the bitline BL to deliver the erase voltage VERS to the lower string selection lines SSLd, and the second voltage V2 lower than the erase voltage VERS may be applied to the lower string selection lines SSLd to thereby cause gate-induced drain leakage (i.e., GIDL) between the uppermost string selection lines SSLu and the lower string selection lines SSLd. As a result, the erase voltage VERS applied to the bitline BL may be provided or delivered to the channel in the memory block. In other words, GIDL can occur between the bitline BL and the uppermost string selection lines SSLu in an otherwise conventional nonvolatile memory device. However, GIDL may also occur between the uppermost string selection lines SSLu and the lower string selection lines SSLd in the nonvolatile memory device according to example embodiments of the invention.

In some example embodiments, as with the bottom GIDL scheme, the first voltage V1 may start to apply to the uppermost string selection lines SSLu at a first time point t1, the erase voltage VERS may start to apply to the bitline BL at a second time point t2 that is later than the first time point t1, and the second voltage V2 may start to apply to the lower string selection lines SSLd at a third time point t3 that is later than the second time point t2.

While the erase voltage VERS is applied to the bitline BL, operations of driving the common source line contact CSLC and the ground selection lines GGSL and GSLu in FIG. 9 may be substantially the same as operations of driving the bitline BL and the string selection lines SSLu and SSLd in FIG. 7, respectively, and operations of driving the wordlines WL and the dummy wordlines DWL0 and DWL1 in FIG. 9 may be substantially the same as operations of driving the wordlines WL and the dummy wordlines DWL0 and DWL1 in FIG. 7, respectively.

Figure 10:
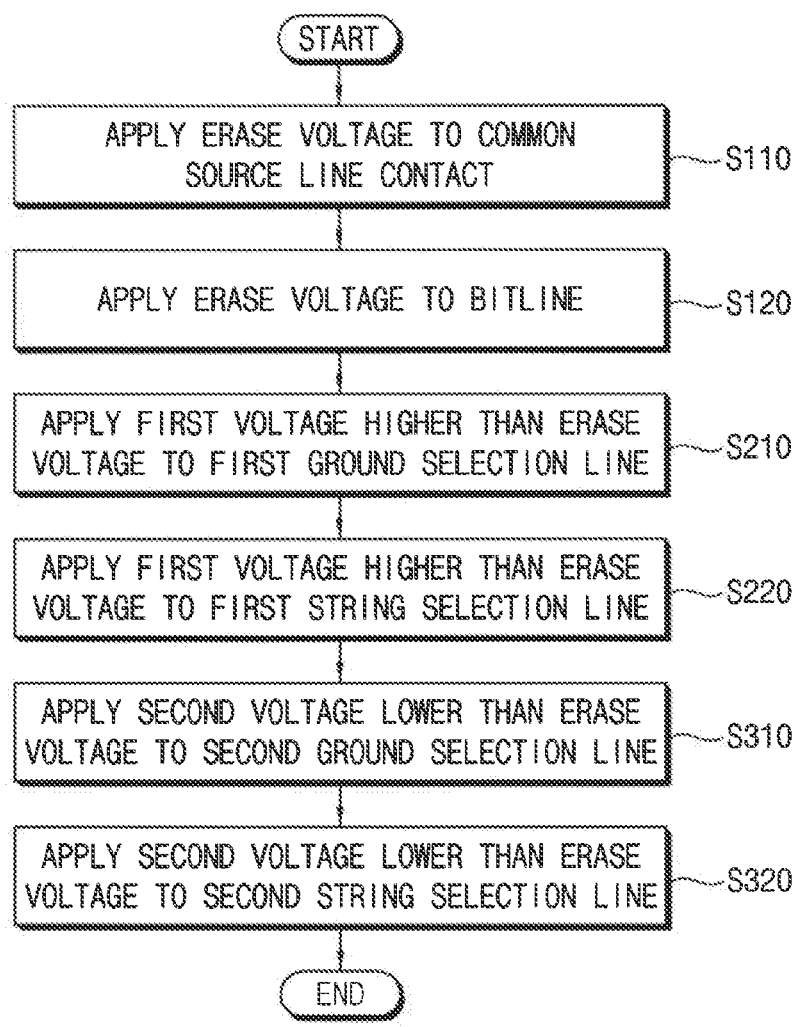
FIG. 10 is a flow chart illustrating still another example of the method of FIG. 1.
Figure 11:
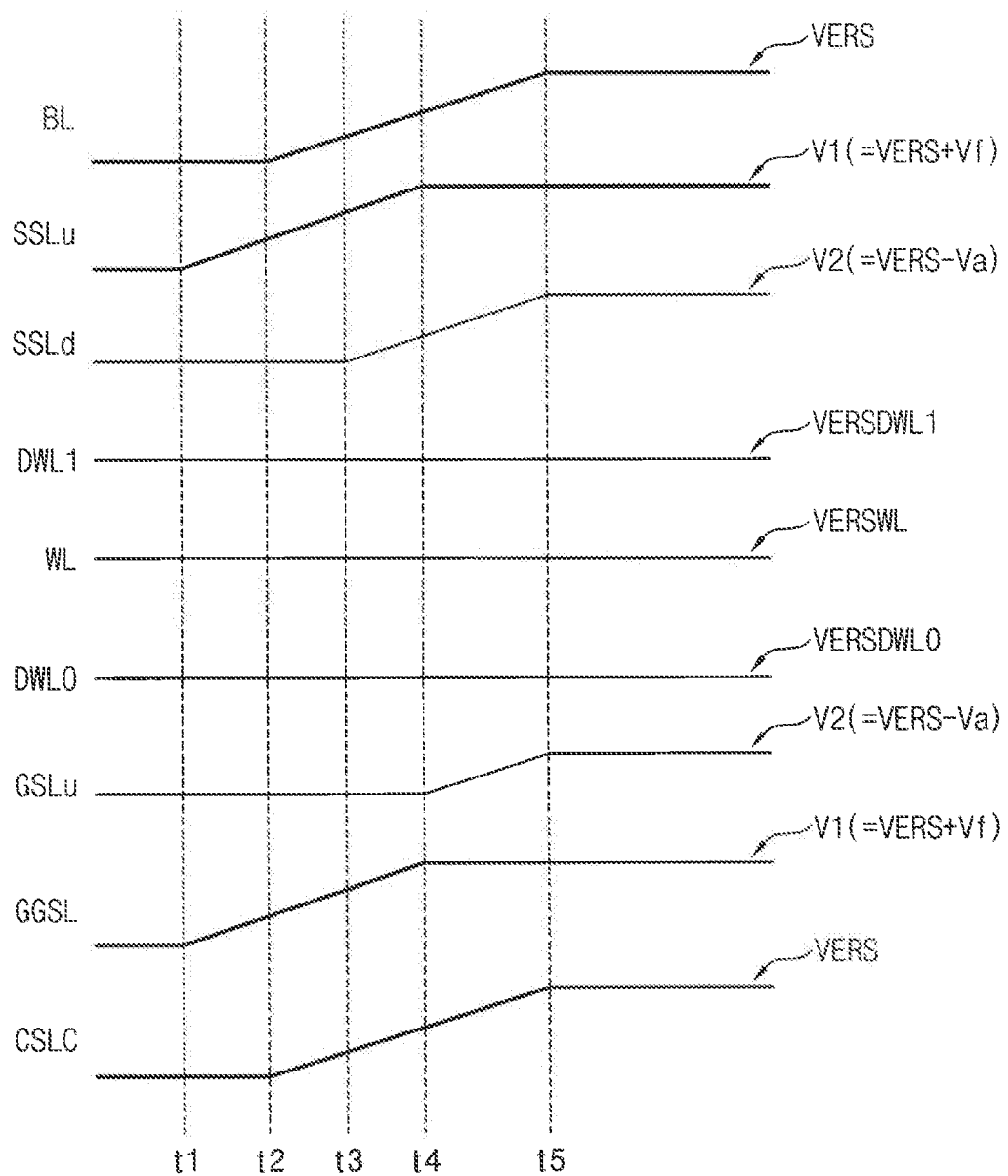
FIG. 11 is a timing diagram for describing the method of FIG. 10.

FIG. 10 is a flow chart illustrating still another example of the method of FIG. 1. FIG. 11 is a timing diagram for describing the method of FIG. 10. Referring to FIGS. 1, 5, 10 and 11, in applying the erase voltage to the erase source terminal (step S100), the erase voltage VERS may be applied to the common source line contact CSLC (step S110), and the erase voltage VERS may be applied to the bitline BL simultaneously (step S120). In applying the first voltage to the first selection line (step S200), the first voltage V1 may be applied to the lowermost ground selection line GGSL (step S210), and the first voltage V1 may be applied to the uppermost string selection lines SSLu simultaneously (step S220). In applying the second voltage to the second selection line (step S300), the second voltage V2 may be applied to the upper ground selection lines GSLu on the lowermost ground selection line GGSL (step S310), and the second voltage V2 may be applied to the lower string selection lines SSLd under the uppermost string selection lines SSLu simultaneously (step S320).

A data erase operation illustrated in FIGS. 8 and 9 may be performed by a mixed/hybrid GIDL scheme in which the bottom GIDL scheme described with reference to FIGS. 6 and 7 and the top GIDL scheme described with reference to FIGS. 8 and 9 are incorporated with each other. Steps S110, S210 and S310 in FIG. 10 may be substantially the same as steps S110, S210 and S310 in FIG. 6, respectively, and steps S120, S220 and S320 in FIG. 10 may be substantially the same as steps S120, S220 and S320 in FIG. 8, respectively. Operations of driving the common source line contact CSLC, the ground selection lines GGSL and GSLu, the wordlines WL and the dummy wordlines DWL0 and DWL1 in FIG. 11 may be substantially the same as operations of driving the common source line contact CSLC, the ground selection lines GGSL and GSLu, the wordlines WL and the dummy wordlines DWL0 and DWL1 in FIG. 7, respectively, and operations of driving the bitline BL and the string selection lines SSLu and SSLd in FIG. 11 may be substantially the same as operations of driving the bitline BL and the string selection lines SSLu and SSLd in FIG. 9, respectively.

Figure 12:
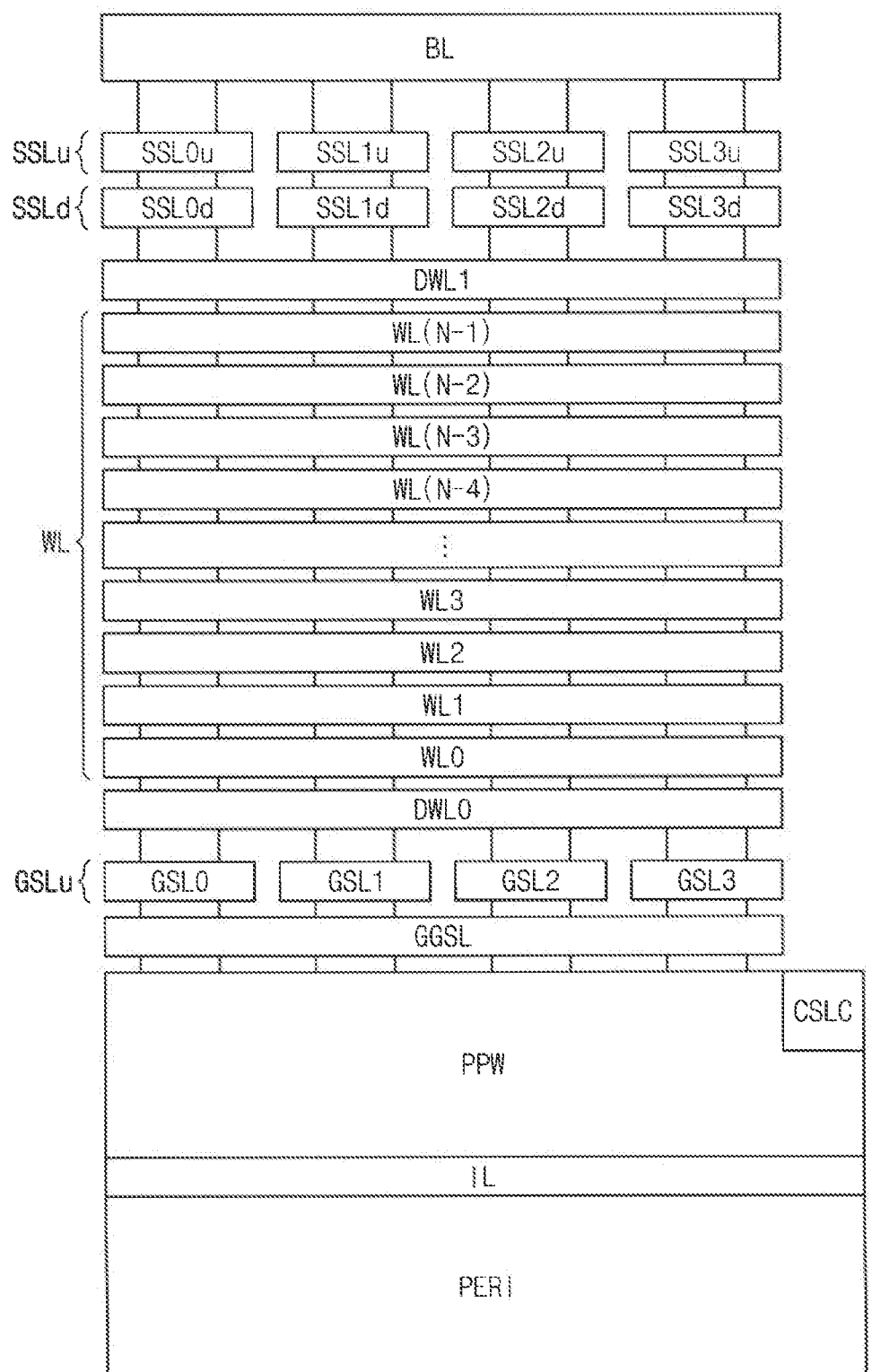
FIG. 12 is a cross-sectional view of an example of a memory block that is included in a nonvolatile memory device according to example embodiments.

FIG. 12 is a cross-sectional view of an example of a memory block that is included in a nonvolatile memory device according to example embodiments. As shown by FIG. 12, a memory block may be implemented with a cell over periphery (COP) structure in which a peripheral circuit PERI (e.g., the row decoder 120, the page buffer circuit 130, the data I/O circuit 140, the voltage generator 150, the control circuit 160, etc.) is formed on a semiconductor substrate, and an insulation layer IL and a memory cell array including the memory block is stacked on the peripheral circuit PERI. The nonvolatile memory device may have a relatively small size by adopting the COP structure. The memory block of FIG. 12 may be substantially the same as the memory block of FIG. 5, except that the memory block of FIG. 12 is implemented with the COP structure.

When the memory block is implemented with the COP structure, a metal layer or a doped region may be formed to be directly connected to a channel of the memory block. When a data erase operation is performed for a memory block having a COP structure, which is based on a bulk erase scheme in which the erase voltage VERS is directly applied to the substrate PPW, the erase voltage VERS is not sufficiently provided to the channel of the memory block due to the metal layer or the doped region. Thus, in the memory block implemented with the COP structure, the GIDL scheme according to example embodiments may be efficient for the data erase operation in comparison with the bulk erase scheme.

Although example embodiments are described with reference to FIGS. 5 through 12 based on examples including ground selection lines with two stages and string selection lines with two stages in the vertical direction, inventive concepts are not limited thereto. For example, example embodiments may be employed to various examples where a memory block includes ground selection lines with three or more stages and string selection lines with three or more stages in the vertical direction and GIDL occurs between any two adjacent ground selection lines and/or between any two adjacent string selection lines.

Figure 13:
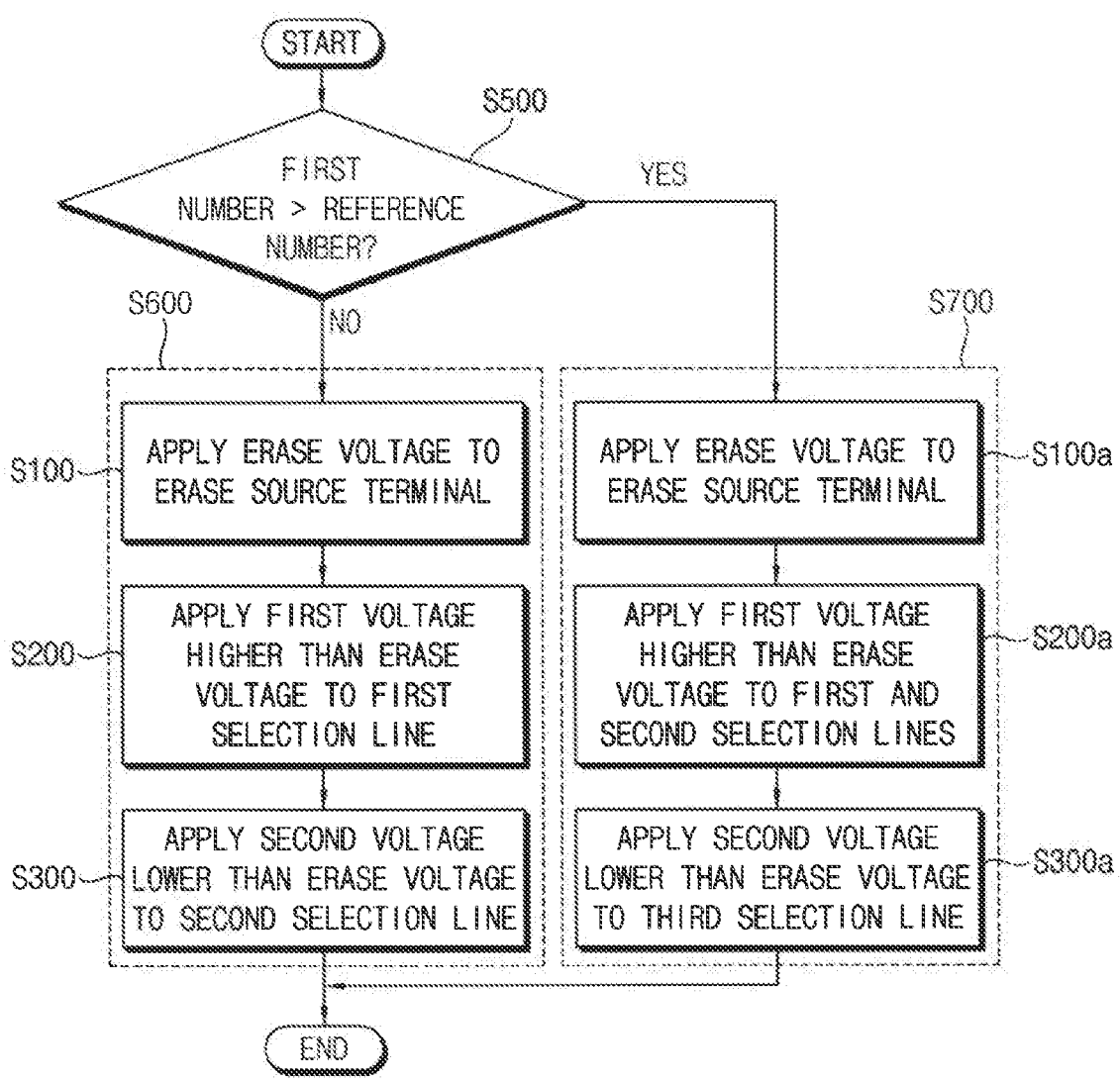
FIG. 13 is a flow chart illustrating a method of erasing data in a nonvolatile memory device according to example embodiments.

FIG. 13 is a flow chart illustrating a method of erasing data in a nonvolatile memory device according to example embodiments. Referring to FIG. 13, a method of erasing data according to example embodiments is performed by a nonvolatile memory device including one or more memory blocks, and a plurality of memory cells are disposed in a vertical direction in each memory block. In addition, each memory block includes a plurality of selection lines that include a plurality of ground selection lines with three or more stages and a plurality of string selection lines with three or more stages in the vertical direction.

In the method of erasing data in the nonvolatile memory device according to example embodiments, when a command and an address for performing a data erase operation are received, it is determined first whether a first number representing the number of times in which the data erase operation has been performed is greater than a reference number (step S500). Then, is the first number is smaller than or equal to the reference number (step S500: NO), a data erase scheme may be maintained to perform the data erase operation (step S600). In other words, when the number of times in which the data erase operation has been performed is smaller than or equal to the reference number, the data erase operation may be performed based on an erase scheme that is initially set or determined. For example, an erase voltage is applied to an erase source terminal of the memory block (step S100), a first voltage that is higher than the erase voltage is applied to a first selection line among a plurality of selection lines in the memory block (step S200), and a second voltage that is lower than the erase voltage is applied to a second selection line among the plurality of selection lines (step S300).

Steps S100, S200 and S300 in FIG. 13 may be substantially the same as steps S100, S200 and S300 in FIG. 1, respectively, and may be performed based on examples described with reference to FIGS. 5 through 11. For example, the data erase operation may be performed by establishing GIDL between the lowermost ground selection line GGSL and ground selection lines disposed above the ground selection line GGSL and/or between the uppermost string selection lines SSLu and string selection lines disposed lower than the string selection lines SSLu.

When the first number is greater than the reference number (step S500: YES), (e.g., when the number of times in which the data erase operation has been performed is greater than the reference number), the data erase scheme may be changed to perform the data erase operation (step S700). For example, the erase voltage is applied to the erase source terminal of the memory block (step S100a), the first voltage that is higher than the erase voltage is applied to the first selection line and the second selection line (step S200a), and the second voltage that is lower than the erase voltage is applied to a third selection line among the plurality of selection lines (step S300a). The third selection line represents a selection line that is disposed farther from the erase source terminal than the second selection line and is used for selecting the memory block as the erase target block. In other words, a location of the GIDL in step S700 may be different from a location of the GIDL in step S600.

Figure 14:
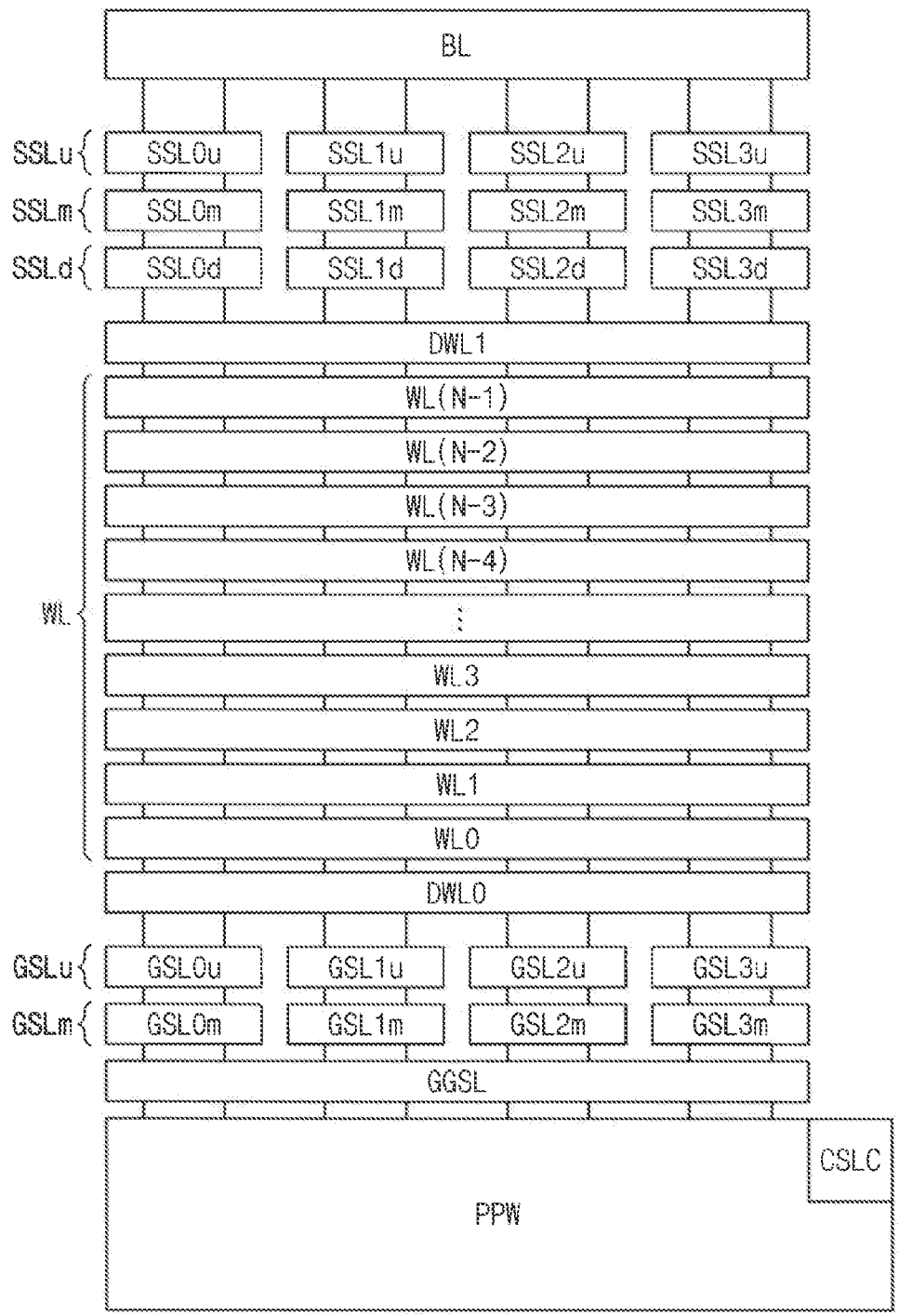
FIG. 14 is a cross-sectional view of an example of a memory block that is included in a nonvolatile memory device according to example embodiments.

FIG. 14 is a cross-sectional view of an example of a memory block that is included in a nonvolatile memory device according to example embodiments. FIGS. 15, 16, 17 and 18 are timing diagrams for describing the method of FIG. 13.

Referring to FIG. 14, a memory block may be substantially the same as the memory block of FIG. 5, except that the memory block of FIG. 14 includes ground selection lines with three stages and string selection lines with three stages in the vertical direction. The ground selection lines may include a lower (or lowermost) ground selection line GGSL, middle ground selection lines GSLm (e.g., GSL0m, GSL1m, GSL2m and GSL3m), and upper ground selection lines GSLu (e.g., GSL0u, GSL1u, GSL2u and GSL3u). The string selection lines may include lower string selection lines SSLd (e.g., SSL0d, SSL1d, SSL2d and SSL3d), middle string selection lines SSLm (e.g., SSL0m, SSL1m, SSL2m and SSL3m), and upper (or uppermost) string selection lines SSLu (e.g., SSL0u, SSL1u, SSL2u and SSL3u).

Figure 15:
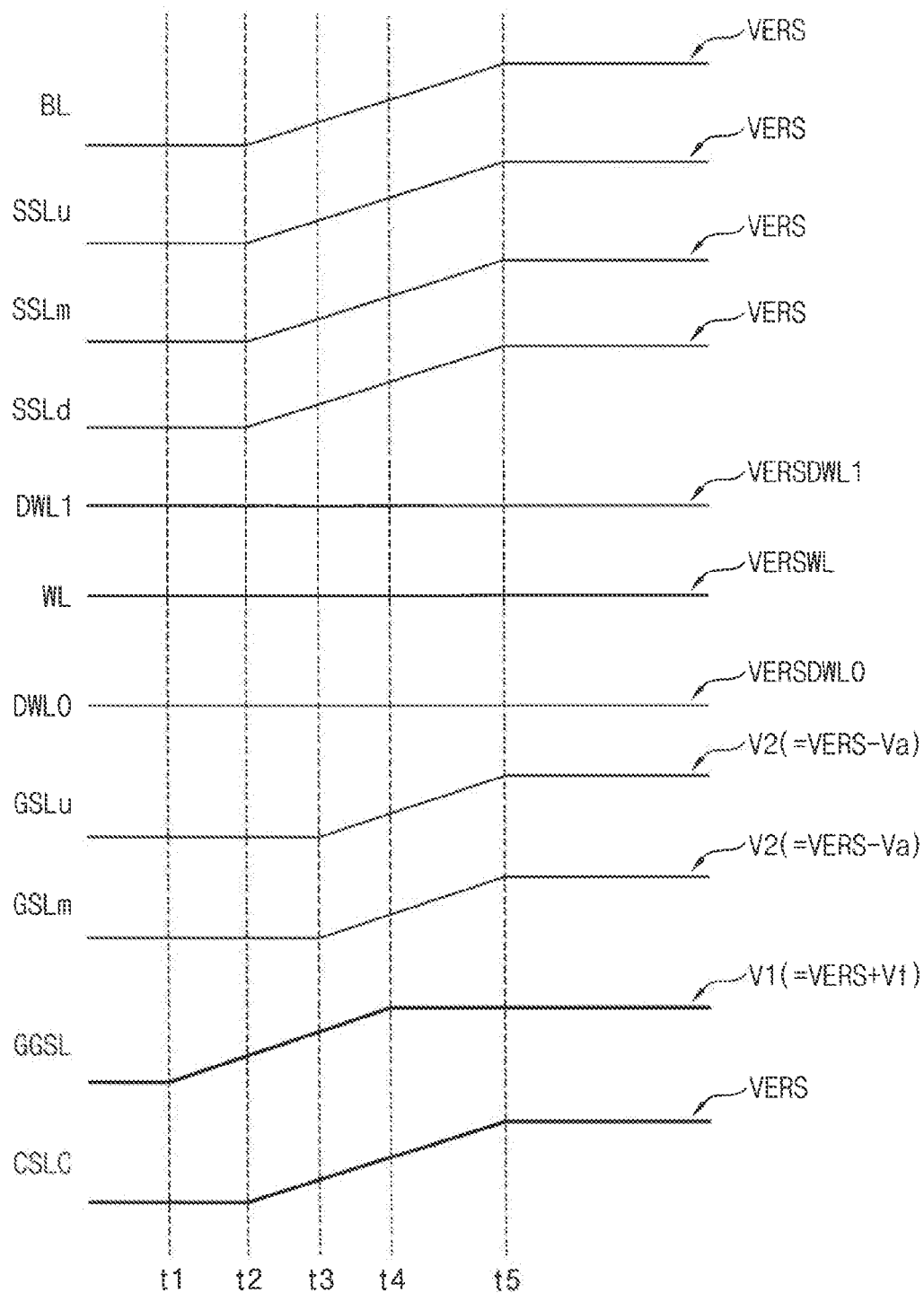
FIGS. 15, 16, 17 and 18 are timing diagrams for describing the method of FIG. 13.

Referring to FIGS. 13, 14, 15 and 16, the data erase operation may be performed based on the bottom GIDL scheme. Thus, when the first number is smaller than or equal to the reference number (step S500: NO), the data erase operation may be performed such that GIDL occurs between the lowermost ground selection line GGSL and the middle ground selection lines GSLm, as illustrated in FIG. 15.

Operations of driving the common source line contact CSLC and the ground selection line GGSL in FIG. 15 may be substantially the same as operations of driving the common source line contact CSLC and the ground selection line GGSL in FIG. 7, respectively, and operations of driving the ground selection lines GSLm and GSLu in FIG. 15 may be substantially the same as an operation of driving the ground selection lines GSLu in FIG. 7.

Figure 16:
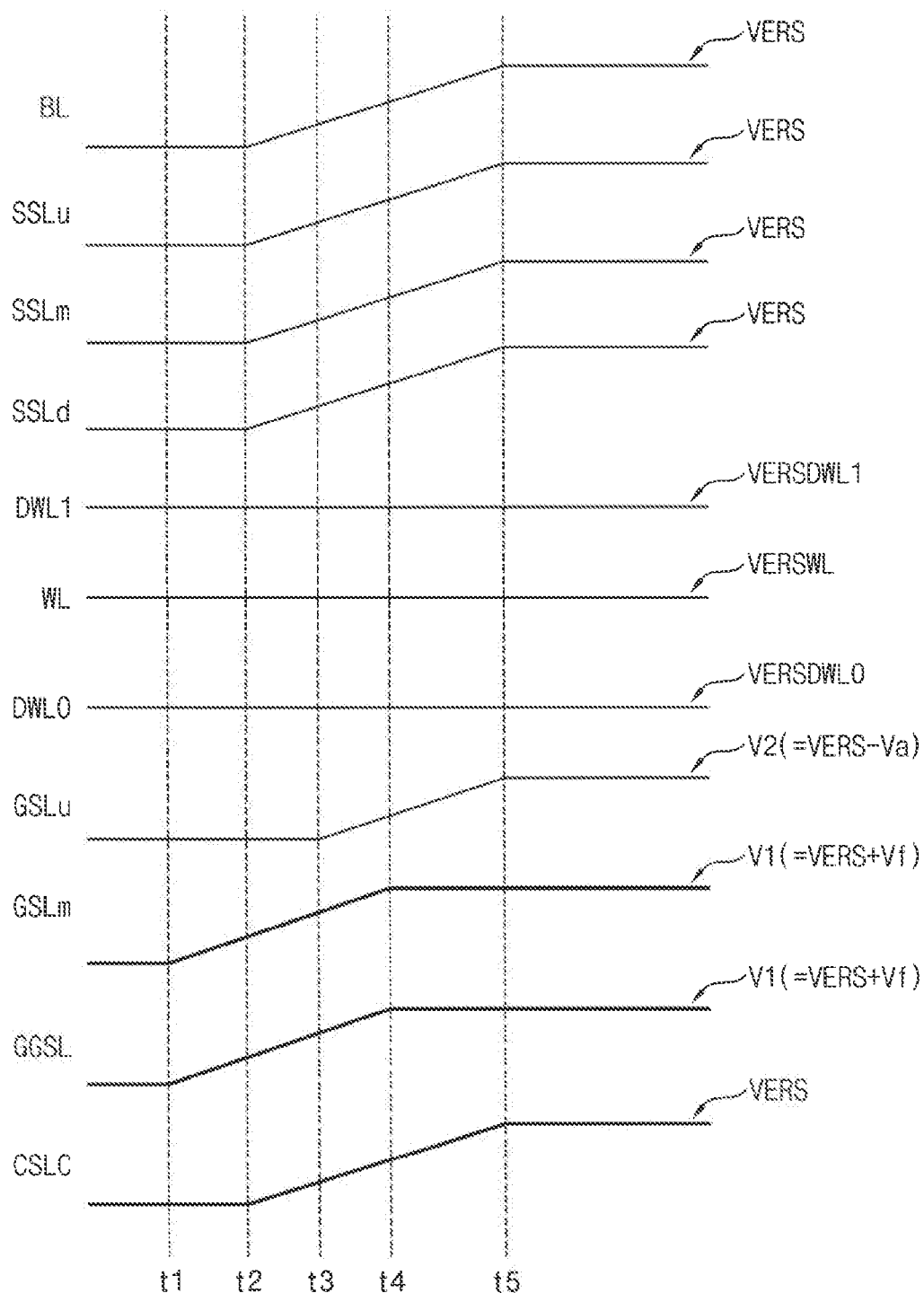

When the first number is greater than the reference number (step S500: YES), the data erase operation may be performed such that GIDL occurs between the middle ground selection lines GSLm and the upper ground selection lines GSLu, as illustrated in FIG. 16. Operations of driving the common source line contact CSLC and the ground selection line GSLu in FIG. 16 may be substantially the same as operations of driving the common source line contact CSLC and the ground selection line GSLu in FIG. 7, respectively, and operations of driving the ground selection lines GGSL and GSLm in FIG. 16 may be substantially the same as an operation of driving the ground selection line GGSL in FIG. 7.

Figure 17:
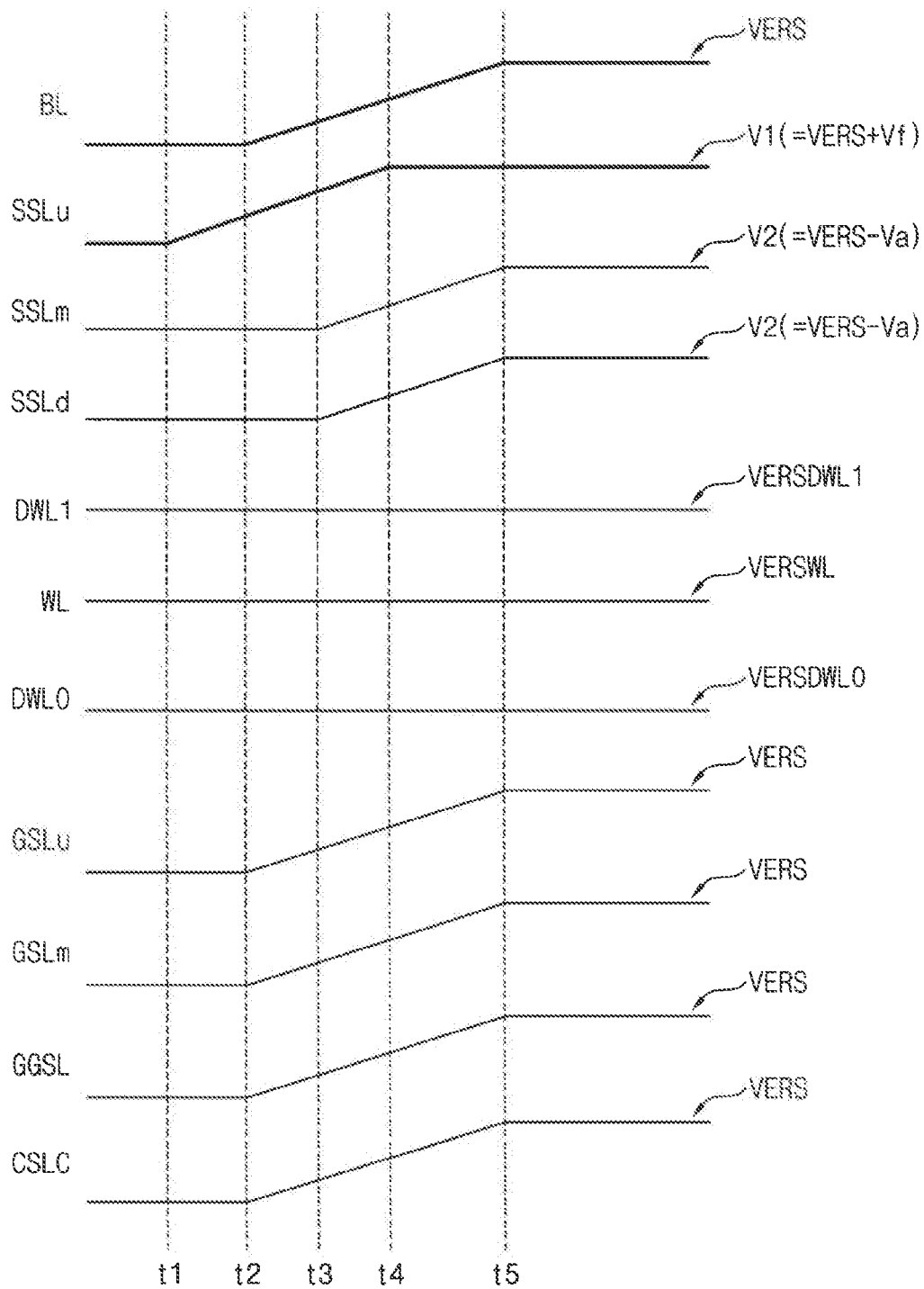

Referring to FIGS. 13, 14, 17 and 18, the data erase operation may be performed based on the top GIDL scheme. When the first number is smaller than or equal to the reference number (step S500: NO), the data erase operation may be performed such that GIDL occurs between the uppermost string selection lines SSLu and the middle string selection lines SSLm, as illustrated in FIG. 17. Operations of driving the bitline BL and the string selection lines SSLu in FIG. 17 may be substantially the same as operations of driving the bitline BL and the string selection lines SSLu in FIG. 9, respectively, and operations of driving the string selection lines SSLm and SSLd in FIG. 17 may be substantially the same as an operation of driving the string selection lines SSLd in FIG. 9.

Figure 18:
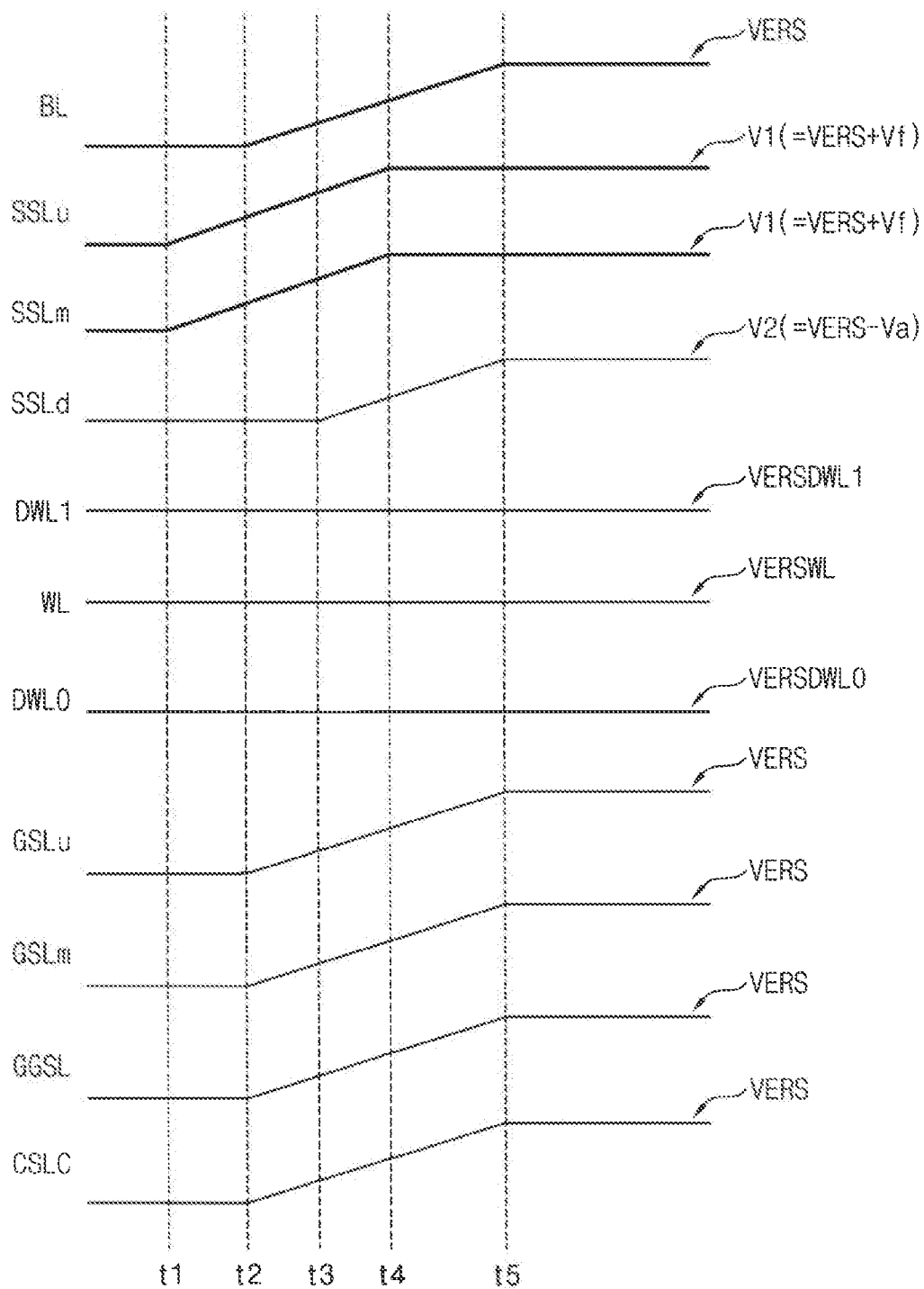

When the first number is greater than the reference number (step S500: YES), the data erase operation may be performed such that GIDL occurs between the middle string selection lines SSLm and the lower string selection lines SSLd, as illustrated in FIG. 18. Operations of driving the bitline BL and the string selection lines SSLd in FIG. 18 may be substantially the same as operations of driving the bitline BL and the string selection lines SSLd in FIG. 9, respectively, and operations of driving the string selection lines SSLu and SSLm in FIG. 18 may be substantially the same as an operation of driving the string selection line SSLu in FIG. 9.

The erase voltage VERS may be applied to all of the bitline BL and the string selection lines SSLu, SSLm and SSLd in FIGS. 15 and 16, and the erase voltage VERS may be applied to all of the common source line contact CSLC and the ground selection lines GGSL, GSLm and GSLu in FIGS. 17 and 18. Operations of driving the wordlines WL and the dummy wordlines DWL0 and DWL1 in FIGS. 15 through 18 may be substantially the same as operations of driving the wordlines WL and the dummy wordlines DWL0 and DWL1 in FIG. 7, respectively.

Although example embodiments are described with reference to FIGS. 13 through 18 based on examples including ground selection lines with three stages and string selection lines with three stages in the vertical direction, inventive concepts are not limited thereto. For example, example embodiments may be employed to various examples where a memory block includes including ground selection lines with four or more stages and string selection lines with four or more stages in the vertical direction and/or a location of occurring GIDL is changed more than two times. Although not illustrated in FIGS. 15 through 18, example embodiments may be employed to an example where the data erase operation is performed by the mixed GIDL scheme in which the bottom GIDL scheme and the top GIDL scheme are incorporated with each other.

In the method of erasing data in the nonvolatile memory device according to example embodiments, a location of occurring GIDL may be changed according to the number of times in which the data erase operation has been performed, and thus reliability of the data erase operation may be improved.

Figure 19:
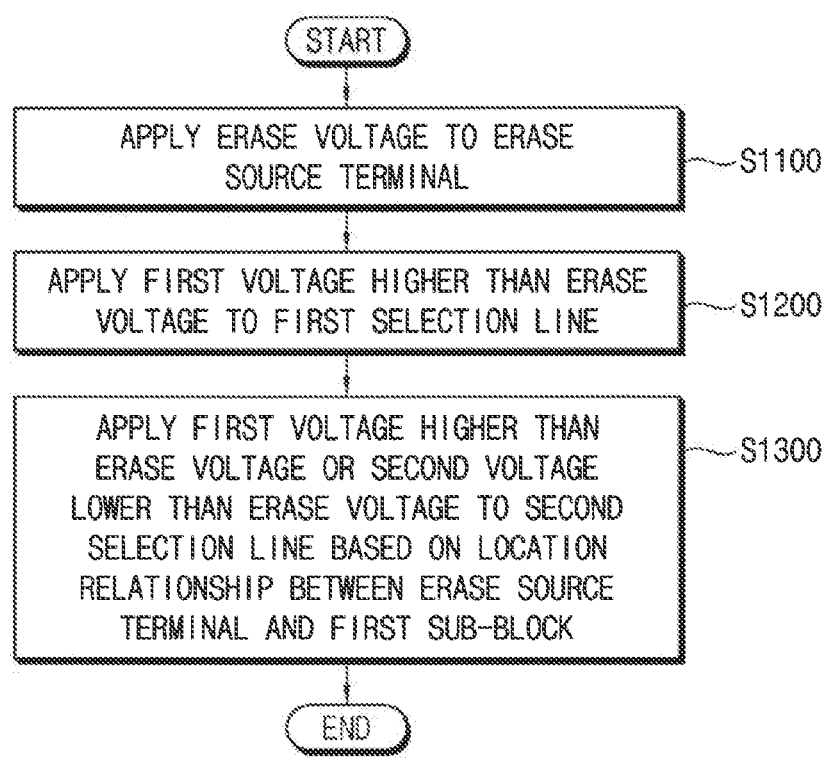
FIG. 19 is a flow chart illustrating a method of erasing data in a nonvolatile memory device according to example embodiments.

FIG. 19 is a flow chart illustrating a method of erasing data in a nonvolatile memory device according to example embodiments. As shown by FIG. 19, a method of erasing data according to example embodiments is performed by a nonvolatile memory device including one or more memory blocks, a plurality of memory cells are disposed in a vertical direction in each memory block, and each memory block is divided into a plurality of sub-blocks (e.g., a first sub-block and a second sub-block) in the vertical direction. In other words, a data erase operation may be performed by units of a sub-block, and not by units of a memory block.

In these method of erasing data in the nonvolatile memory device according to example embodiments, an erase voltage is applied to an erase source terminal of the memory block (step S1100). The erase source terminal represents a terminal that receives the erase voltage from an outside of the memory block (e.g., from a voltage generator). Step S1100 in FIG. 19 may be substantially the same as step S100 in FIG. 1.

A first voltage that is higher than the erase voltage is applied to a first selection line among a plurality of selection lines in the memory block (step S1200). The first selection line represents a selection line that is disposed closest to the erase source terminal among the plurality of selection lines and is used for selecting the first sub-block as an erase target sub-block.

The first voltage that is higher than the erase voltage or a second voltage that is lower than the erase voltage is applied to a second selection line among the plurality of selection lines based on a location relationship between the erase source terminal and the first sub-block (step S1300). The second selection line represents a selection line that is disposed farther from the erase source terminal than the first selection line and is used for selecting the first sub-block as the erase target sub-block. The first and second selection lines may be the same type of selection lines. The method of erasing data in the nonvolatile memory device according to example embodiments may be performed based on the GIDL scheme and may be performed based on a command and an address for performing the data erase operation.

Figure 20:
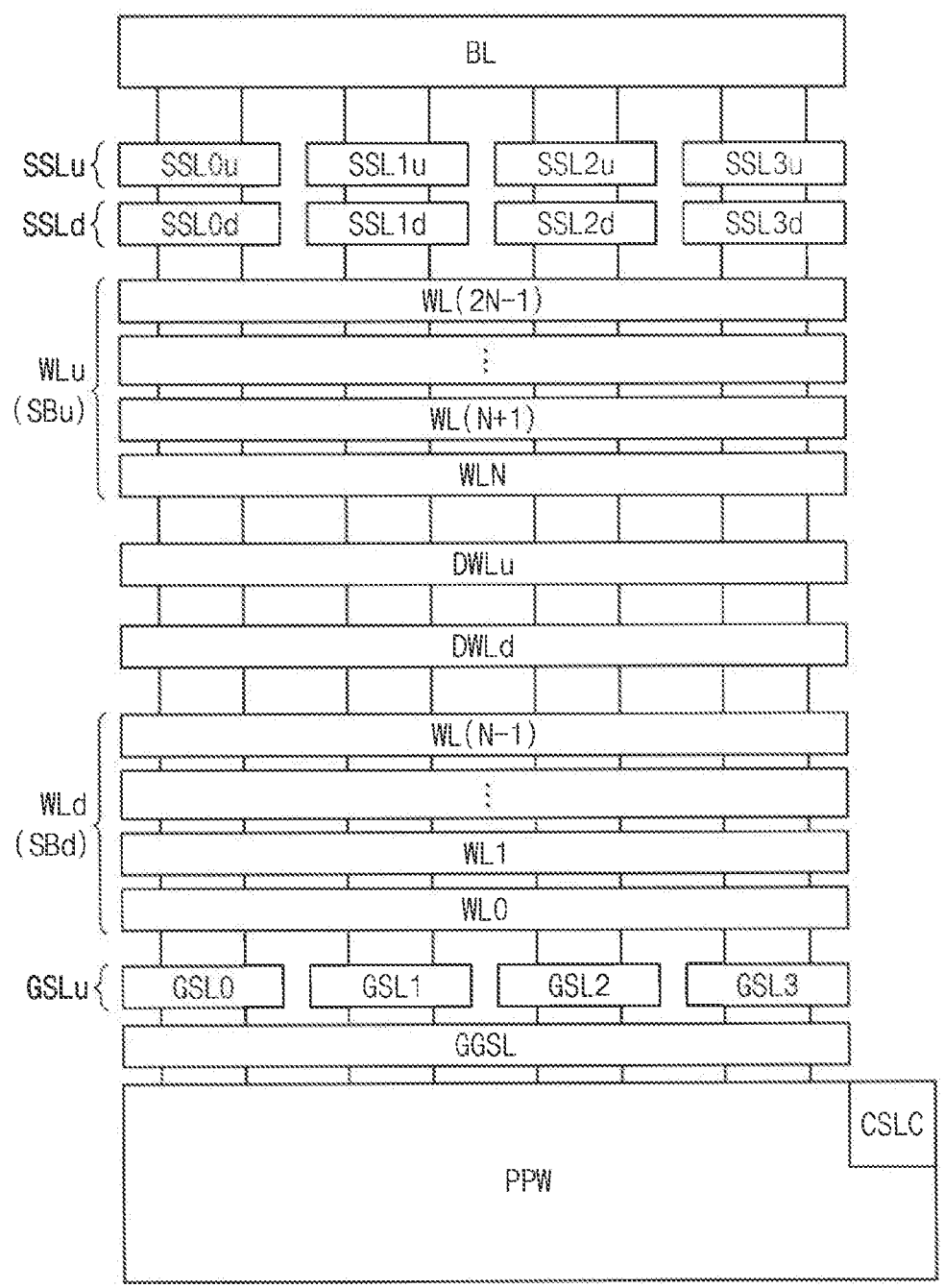
FIG. 20 is a cross-sectional view of an example of a memory block that is included in a nonvolatile memory device according to example embodiments.

FIG. 20 is a cross-sectional view of an example of a memory block that is included in a nonvolatile memory device according to example embodiments.

Referring to FIG. 20, a memory block may be substantially the same as the memory block of FIG. 5, except that the memory block of FIG. 20 is divided into two sub-blocks. Wordlines in FIG. 20 may be divided into lower wordlines WLd (e.g., WL0, WL1, WL(N−1)) and upper wordlines WLu (e.g., WLN, WL(N+1), WL(2N−1)) by dummy wordlines DWLd and DWLu. Memory cells connected to the upper wordlines WLu may form an upper sub-block or a first sub-blocks SBu, and memory cells connected to the lower wordlines WLd may form a lower sub-block or a second sub-blocks SBd.

Figure 21:
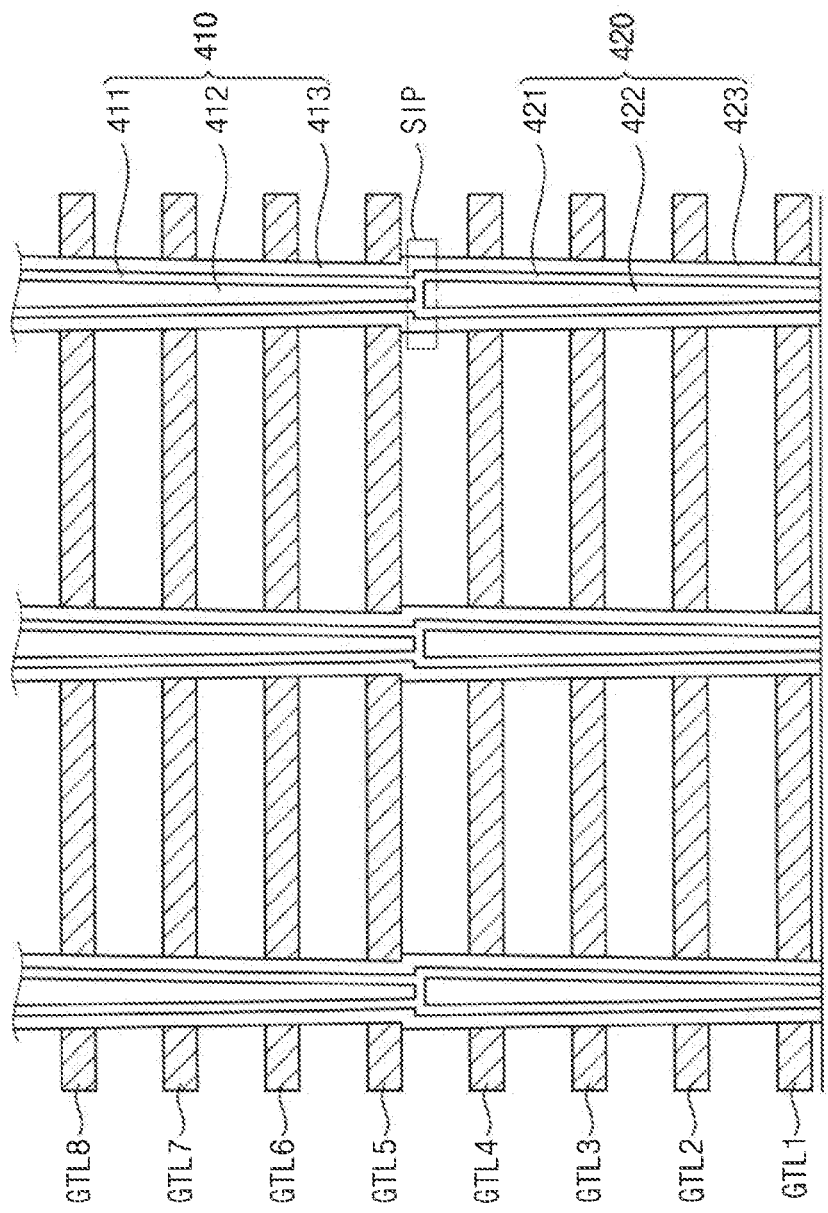
FIG. 21 is a cross-sectional view for describing a structure of the memory block of FIG. 20.

FIG. 21 is a cross-sectional view for describing a structure of the memory block of FIG. 20. Referring to FIG. 21, a channel hole of each cell string may include a first sub channel hole 410 and a second sub channel hole 420. A channel hole may be referred to as a pillar. The first sub channel hole 410 may include a channel layer 411, an inner material 412 and an insulation layer 413. The second sub channel hole 420 may include a channel layer 421, an inner material 422 and an insulation layer 423. The channel layer 411 of the first channel hole 410 may be connected to the channel layer 421 of the second sub channel hole 420 through a p-type silicon pad SIP. The sub channel holes 410 and 420 may be formed using a stopper line GTL5 having an appropriate etch rate. For example, the stopper line GTL5 may be formed of polysilicon and the other wordlines GTL1, GTL2, GTL3, GTL4, GTL6, GTL7 and GTL8 may be formed of metal such as tungsten to implement the appropriate etch rate.

The dummy wordlines DWLd and DWLu between the sub-blocks SBu and SBd in FIG. 20 may correspond to the stopper layer GTL5 that is used to form the plurality of sub channel holes. The cells in the stopper layer GTL5 may be improper for storing data.

As described with reference to FIGS. 20 and 21, a structure in which one channel hole is formed using a plurality of sub channel holes may be referred to as a multi-stacked string structure or simply a multi-stacked structure. The multi-stacked structure may be adopted when it is difficult to form one channel hole at once because of increasing the number of stacked wordlines. When the memory block is implemented with the multi-stacked structure, a metal layer or a doped region may be formed to be directly connected to a channel of the memory block. Thus, in the memory block implemented with the multi-stacked structure, the GIDL scheme according to example embodiments may be efficient for the data erase operation in comparison with the bulk erase scheme.

Figure 22:
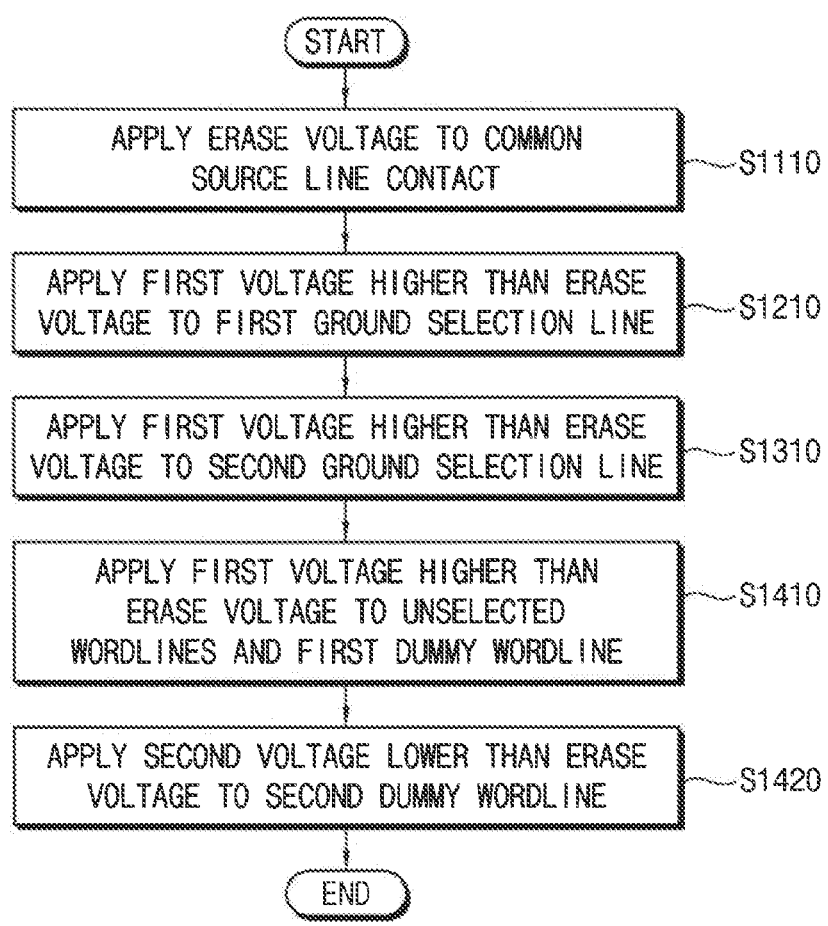
FIG. 22 is a flow chart illustrating an example of the method of FIG. 19.
Figure 23:
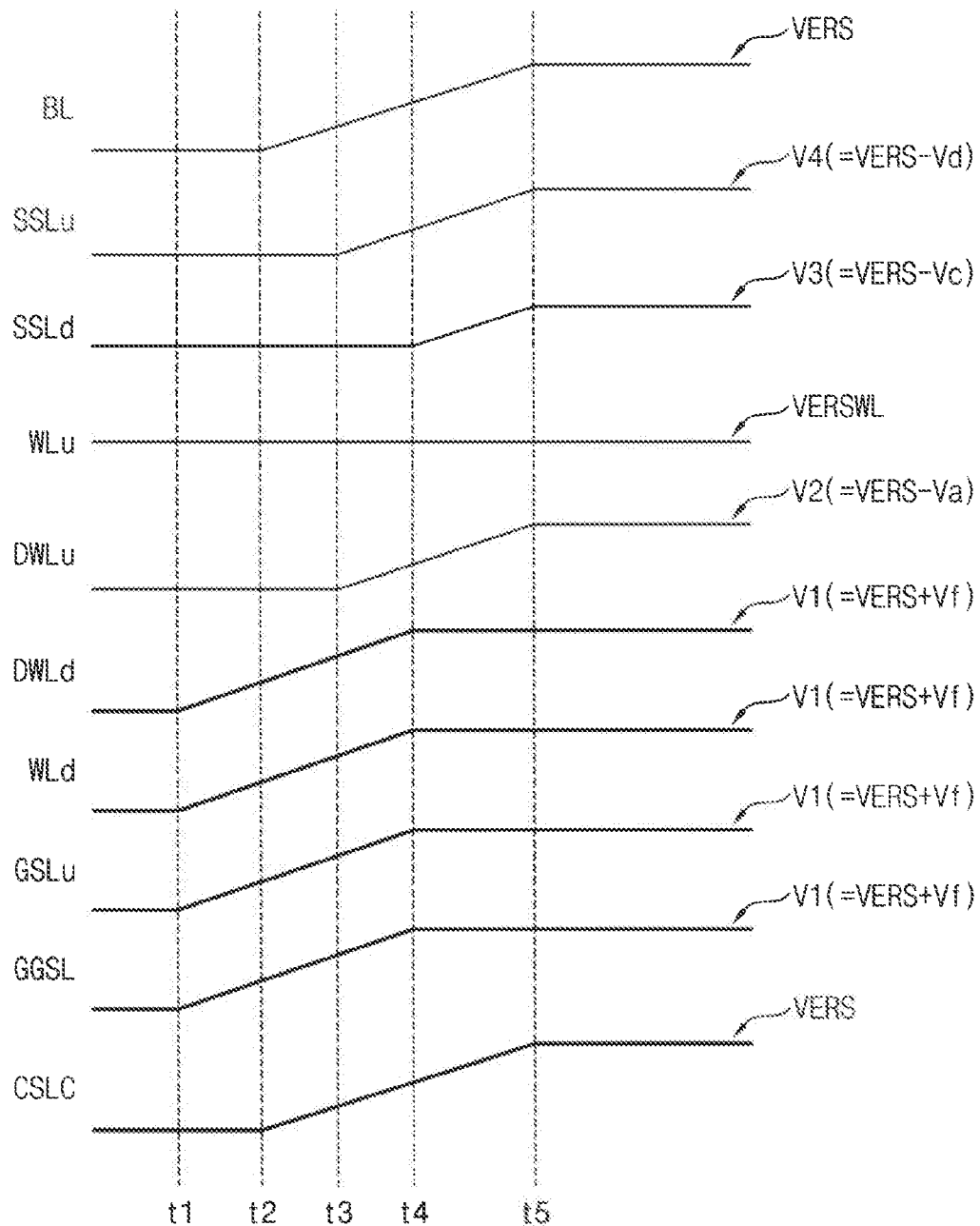
FIG. 23 is a timing diagram for describing the method of FIG. 22.

FIG. 22 is a flow chart illustrating an example of the method of FIG. 19. FIG. 23 is a timing diagram for describing the method of FIG. 22. Referring to FIGS. 19, 20, 22 and 23, the data erase operation may be performed based on the bottom GIDL scheme, and the first sub-block SBu representing the erase target sub-block may be disposed upper than the second sub-block SBd.

In applying the erase voltage to the erase source terminal (step S1100), the erase voltage VERS may be applied to the common source line contact CSLC (step S1110). In applying the first voltage to the first selection line (step S1200), the first voltage V1 may be applied to the lowermost ground selection line GGSL (step S1210). In applying the first voltage or the second voltage to the second selection line (step S1300), the first voltage V1 may be applied to the ground selection lines GSLu that are disposed upper than the ground selection line GGSL (step S1310). Additionally, the first voltage V1 may be applied to the wordlines WLd connected to the second sub-block SBd and the dummy wordline DWLd disposed closer to the second sub-block SBd than the dummy wordline DWLu (step S1410), and the second voltage V2 may be applied to the dummy wordline DWLu disposed closer to the first sub-block SBu than the dummy wordline DWLd (step S1420).

In the method of erasing data in the nonvolatile memory device according to example embodiments, the first voltage V1 higher than the erase voltage VERS may be applied to the ground selection lines GGSL and GSLu, the wordlines WLd and the dummy wordline DWLd to deliver the erase voltage VERS to the dummy wordline DWLu, and the second voltage V2 lower than the erase voltage VERS may be applied to the dummy wordline DWLu to occur GIDL between the dummy wordline DWLd and the dummy wordline DWLu. As a result, the erase voltage VERS applied to the common source line contact CSLC may be provided or delivered to a channel in the first sub-block SBu. In other words, GIDL may occur between the dummy wordline DWLd and the dummy wordline DWLu.

Operations of driving the bitlines BL, the string selection lines SSLu and SSLd and the wordlines WLu in FIG. 23 may be substantially the same as operation of driving the bitlines BL, the string selection lines SSLu and SSLd and the wordlines WL in FIG. 7, respectively.

Figure 24:
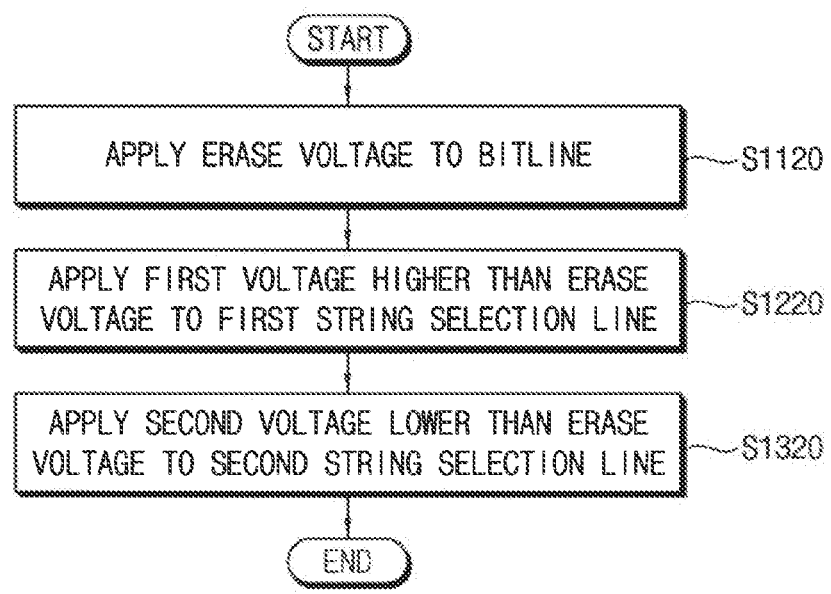
FIG. 24 is a flow chart illustrating another example of the method of FIG. 19.
Figure 25:
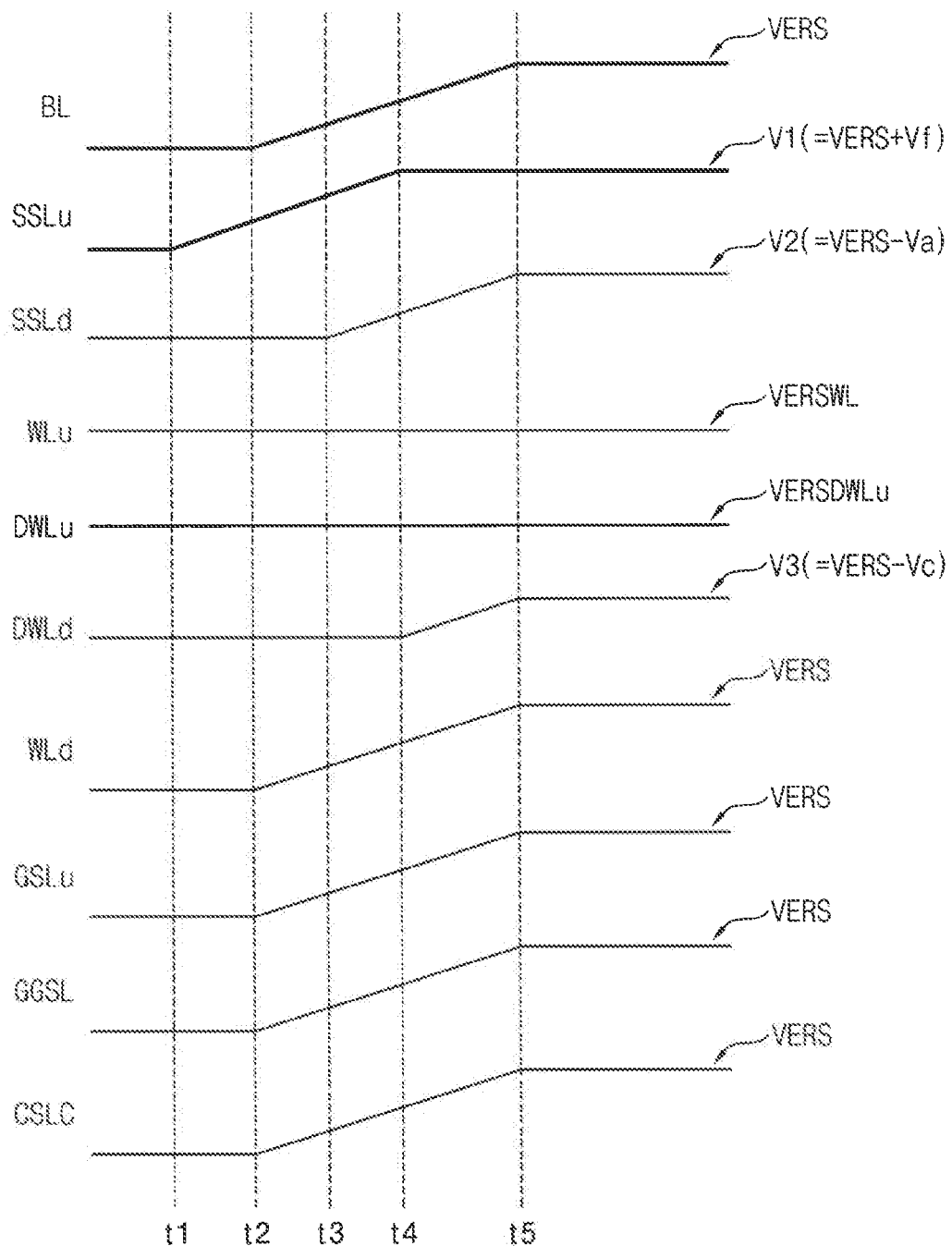
FIG. 25 is a timing diagram for describing the method of FIG. 24.

FIG. 24 is a flow chart illustrating another example of the method of FIG. 19. FIG. 25 is a timing diagram for describing the method of FIG. 24. Referring to FIGS. 19, 20, 24 and 25, the data erase operation may be performed based on the top GIDL scheme, and the first sub-block SBu representing the erase target sub-block may be disposed upper than the second sub-block SBd.

In applying the erase voltage to the erase source terminal (step S1100), the erase voltage VERS may be applied to the bitline BL (step S1120). In applying the first voltage to the first selection line (step S1200), the first voltage V1 may be applied to the uppermost string selection lines SSLu (step S1220). In applying the first voltage or the second voltage to the second selection line (step S1300), the second voltage V2 may be applied to the string selection lines SSLd that are disposed lower than the string selection lines SSLu (step S1320).

Steps S1120, S1220 and S1320 in FIG. 24 may be substantially the same as steps S120, S220 and S320 in FIG. 8, respectively, and an operation of FIG. 25 may be substantially the same as an operation of FIG. 9. In other words, GIDL may occur between the uppermost string selection lines SSLu and the lower string selection lines SSLd.

When the second sub-block SBd is selected as the erase target sub-block, a data erase operation may be similar to the data erase operation described with reference to FIGS. 22 through 25. For example, in the top GIDL scheme, the erase voltage VERS may be applied to the bitline BL, the first voltage V1 may be applied to the string selection lines SSLu and SSLd, the wordlines WLu and the dummy wordline DWLu, the second voltage V2 may be applied to the dummy wordline DWLd, and thus GIDL may occur between the dummy wordline DWLu and the dummy wordline DWLd. In the bottom GIDL scheme, the data erase operation may be substantially the same as an operation of FIG. 7.

Although example embodiments are described with reference to FIGS. 20 through 25 based on examples including ground selection lines with two stages, string selection lines with two stages and two sub-blocks, inventive concepts are not limited thereto. For example, example embodiments may be employed to various examples where a memory block includes ground selection lines with three or more stages and string selection lines with three or more stages and/or includes three or more sub-blocks. In addition, example embodiments may be employed to an example where the data erase operation is performed by the mixed GIDL scheme and/or an example where a location of occurring GIDL is changed according to the number of times in which the data erase operation has been performed.

As will be appreciated by those skilled in the art, the present disclosure may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain, or store a program for use by or in connection with an instruction execution system, apparatus, or device. For example, the computer readable medium may be a non-transitory computer readable medium.

Figure 26:
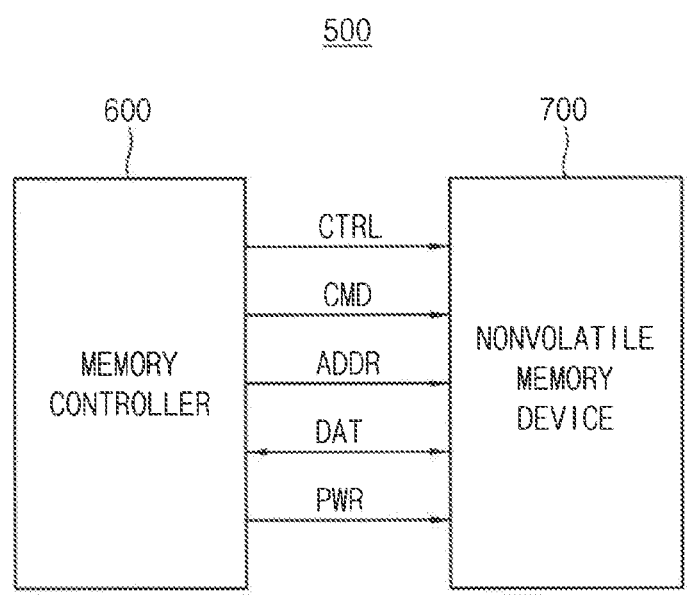
FIG. 26 is a block diagram illustrating a memory system according to example embodiments.

FIG. 26 is a block diagram illustrating a memory system according to example embodiments. Referring to FIG. 26, a memory system 500 includes a memory controller 600 and at least one nonvolatile memory device 700. The nonvolatile memory device 700 may correspond to the nonvolatile memory device according to example embodiments, and may perform data erase, program (or write) and/or read operations under control of the memory controller 600. The nonvolatile memory device 700 may receive a command CMD and an address ADDR through I/O lines from the memory controller 600 for performing such operations, and may exchange data DAT with the memory controller 600 for performing such program or read operation. In addition, the nonvolatile memory device 700 may receive a control signal CTRL through a control line from the memory controller 600. In addition, the nonvolatile memory device 700 receives a power PWR through a power line from the memory controller 600.

Figure 27:
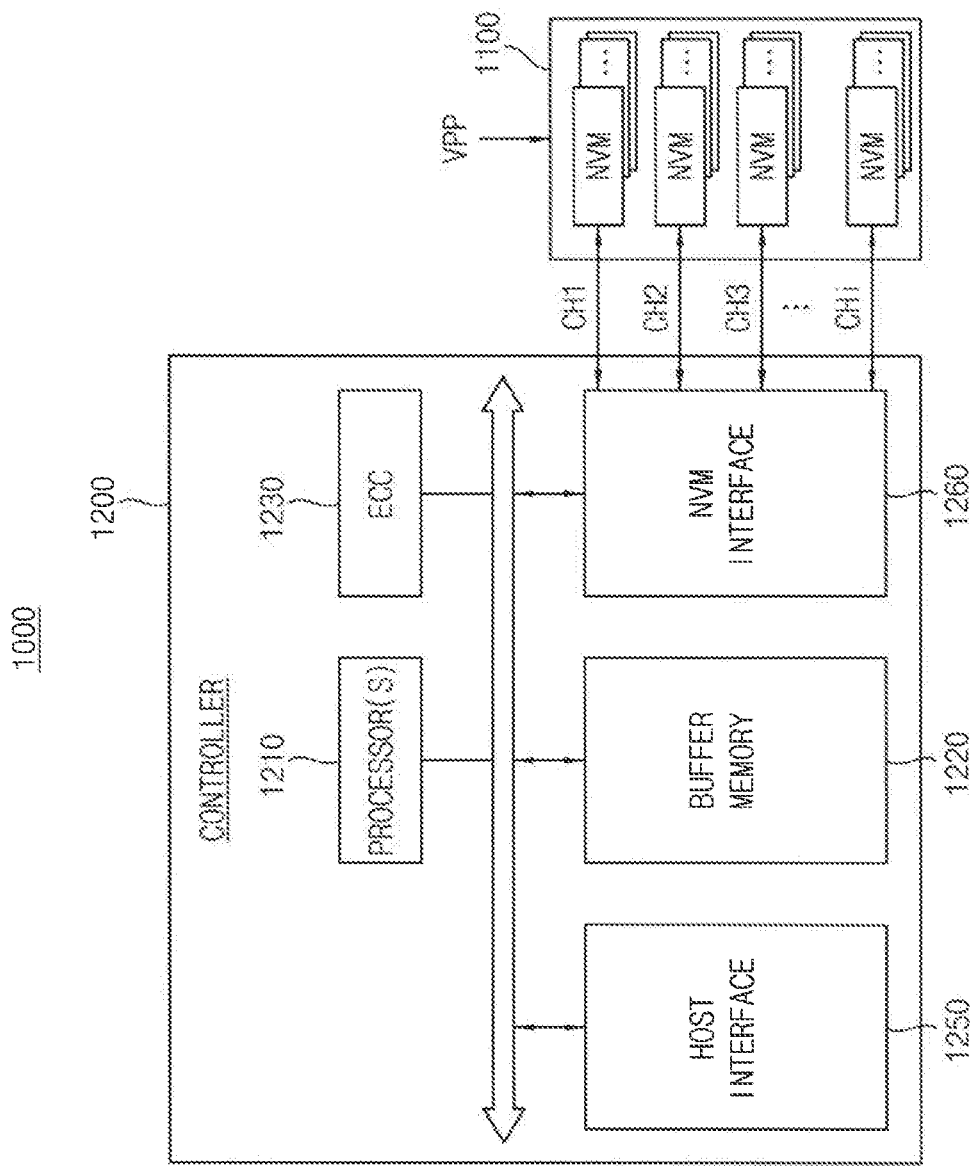
FIG. 27 is a block diagram illustrating a storage device that includes a nonvolatile memory device according to example embodiments.

FIG. 27 is a block diagram illustrating a storage device that includes a nonvolatile memory device according to example embodiments. Referring to FIG. 27, a storage device 1000 may include a plurality of nonvolatile memory devices 1100 and a controller 1200. For example, the storage device 1000 may be any storage device such as an embedded multimedia card (eMMC), a universal flash storage (UFS), a solid state disc or solid state drive (SSD), etc. The controller 1200 may be connected to the nonvolatile memory devices 1100 via a plurality of channels CH1, CH2, CH3 . . . CHi. The controller 1200 may include one or more processors 1210, a buffer memory 1220, an error correction code (ECC) circuit 1230, a host interface 1250 and a nonvolatile memory interface 1260.

The buffer memory 1220 may store data used to drive the controller 1200. The ECC circuit 1230 may calculate error correction code values of data to be programmed during a program operation, and may correct an error of read data using an error correction code value during a read operation. In a data recovery operation, the ECC circuit 1230 may correct an error of data recovered from the nonvolatile memory devices 1100. The host interface 1250 may provide an interface with an external device. The nonvolatile memory interface 1260 may provide an interface with the nonvolatile memory devices 1100. Each of the nonvolatile memory devices 1100 may correspond to the nonvolatile memory device according to example embodiments, and may be optionally supplied with an external high voltage VPP.

The inventive concept may be applied to various devices and systems that include an nonvolatile memory device. For example, the inventive concept may be applied to systems such as a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A nonvolatile memory device comprising:
   a memory block including a plurality of memory cells disposed in a vertical direction; and
   a control circuit configured to apply an erase voltage to an erase source terminal of the memory block, and configured to apply a first voltage to a first selection line among a plurality of selection lines in the memory block, the first voltage being higher than the erase voltage, the first selection line being disposed closest to the erase source terminal among the plurality of selection lines and being used for selecting the memory block as an erase target block.

2. The nonvolatile memory device of claim 1, wherein:
   the control circuit is configured to apply a second voltage to a second selection line among the plurality of selection lines,
   the second voltage is lower than the erase voltage, and
   the second selection line is disposed farther from the erase source terminal than the first selection line and is used for selecting the memory block as the erase target block.

3. The nonvolatile memory device of claim 1, wherein:
   the memory block is divided into a first sub-block and a second sub-block in the vertical direction,
   the control circuit is configured to apply the first voltage or a second voltage to a second selection line among the plurality of selection lines based on a location relationship between the erase source terminal and the first sub-block,
   the second voltage is lower than the erase voltage, and
   the second selection line is disposed farther from the erase source terminal than the first selection line and is used for selecting the first sub-block as an erase target sub-block.

4. A method of erasing data in a memory block within the nonvolatile memory device, comprising:
   applying a non-zero erase voltage to a drain terminal a first string selection transistor within a vertical NAND string of memory cells comprising at least two string selection transistors;
   applying a first voltage having a magnitude greater than the erase voltage to a first string selection line associated with the first string selection transistor; and
   applying a non-zero second voltage having a magnitude less than the erase voltage to a second string selection line associated with a second string selection transistor below the first string selection transistor within the vertical NAND string of memory cells.

5. The method of claim 4, wherein the source of the first string selection transistor is electrically connected to a drain of the second string selection transistor; wherein said applying the first voltage commences prior to said applying the non-zero erase voltage; and wherein said applying the non-zero erase voltage commences prior to said applying a non-zero second voltage.

6. A method of operating a nonvolatile memory device, comprising:
   erasing data within a NAND string of memory cells within the nonvolatile memory device by applying a non-zero erase voltage to a source/drain terminal at a first end of the NAND string concurrently with establishing gate-induced drain leakage (GIDL) in a pair of selection transistors within the NAND string, by applying unequal and non-zero first and second voltages to respective first and second gate terminals of the pair of selection transistors.

7. The method of claim 6, wherein the pair of selection transistors are a pair of string selection transistors or a pair of ground selection transistors.

8. The method of claim 7, wherein a source of a first one of the pair of selection transistors is electrically connected to a drain of a second one of the pair of selection transistors.

9. The method of claim 6, wherein the first voltage has a magnitude greater than the erase voltage and the second voltage has a magnitude less than the erase voltage.

* * * * *